(12) United States Patent
Abbott et al.

(10) Patent No.: US 6,849,321 B2
(45) Date of Patent: Feb. 1, 2005

(54) SURFACES WITH GRADIENTS IN SURFACE TOPOGRAPHY

(75) Inventors: Nicholas L. Abbott, Madison, WI (US); Yan-Yeung Luk, Madison, WI (US); Matthew Lee Tingey, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 172 days.

(21) Appl. No.: 10/292,369

(22) Filed: Nov. 12, 2002

(65) Prior Publication Data

US 2004/0091620 A1 May 13, 2004

Related U.S. Application Data

(60) Provisional application No. 60/425,132, filed on Nov. 8, 2002.

(51) Int. Cl.$^7$ .......................... G01N 33/53; G01N 27/00
(52) U.S. Cl. ................... 428/141; 422/82.01; 422/68.1; 435/7.1; 436/525
(58) Field of Search ............................... 428/1.62, 141; 427/250; 250/307; 422/68.1, 82.01; 435/4, 6, 7.1, 7.92, 287.1, 287.3; 436/164, 172, 518, 525

(56) References Cited

U.S. PATENT DOCUMENTS

| | | | |
|---|---|---|---|
| 4,597,942 A | 7/1986 | Meathrel | 422/57 |
| 4,628,037 A | 12/1986 | Chagnon et al. | 436/526 |
| 4,725,669 A | 2/1988 | Essex et al. | 530/322 |
| 4,812,556 A | 3/1989 | Vahlne et al. | 530/324 |
| 5,478,527 A | * 12/1995 | Gustafson et al. | 422/82.11 |
| 5,568,256 A | 10/1996 | Körner et al. | 356/359 |
| 5,620,850 A | 4/1997 | Bamdad et al. | 530/300 |
| 5,712,103 A | 1/1998 | Leavitt et al. | 435/7.92 |
| 6,060,327 A | 5/2000 | Keen | 436/518 |
| 6,159,681 A | 12/2000 | Zebala | 435/4 |
| 6,171,802 B1 | 1/2001 | Woolverton et al. | 435/7.1 |
| 6,277,489 B1 | 8/2001 | Abbott et al. | 428/403 |

(List continued on next page.)

FOREIGN PATENT DOCUMENTS

| | | |
|---|---|---|
| DE | 3617710 A1 | 12/1986 |
| EP | 0 284 587 | 8/1988 |

(List continued on next page.)

OTHER PUBLICATIONS

Ennulat, R. D. et al., "Thermal Radiography Utilizing Liquid Crystals," *Molecular Crystals and Liquid Crystals*, vol. 13, pp. 149–164, 1971; published by Gordon and Breach Science Publishers (United Kingdom).

(List continued on next page.)

*Primary Examiner*—Harold Pyon
*Assistant Examiner*—Sow-Fun Hon
(74) *Attorney, Agent, or Firm*—Foley & Lardner LLP

(57) ABSTRACT

A method for preparing a metallized surface that possesses gradients in surface topography includes obliquely depositing a metal from a metal source onto a surface of a support. The surface of the support includes a first end, a second end, and a region between the first and second ends. The second end of the surface is located nearer to the metal source than is the first end, and the metal is deposited onto the first end of the surface at a first angle of incidence and the metal is deposited onto the second end of the surface at a second angle of incidence. The first angle of incidence is greater than the second angle of incidence, and the metal is deposited onto the region between the first and second ends at angles of incidence that vary over the region to produce the metallized surface with gradients in surface topography. The angles of incidence are measured from the normal of the support.

33 Claims, 6 Drawing Sheets

U.S. PATENT DOCUMENTS

| | | | |
|---|---|---|---|
| 6,284,197 B1 | 9/2001 | Abbott et al. | 422/82.05 |
| 6,288,392 B1 | 9/2001 | Abbott et al. | 250/307 |
| 6,306,594 B1 | 10/2001 | Cozzette et al. | 435/6 |
| 2002/0055093 A1 | 5/2002 | Abbott et al. | 435/5 |
| 2002/0164604 A1 | 11/2002 | Abbott et al. | 435/6 |

FOREIGN PATENT DOCUMENTS

| | | |
|---|---|---|
| EP | 0 345 462 | 12/1989 |
| JP | 02311822 A2 | 12/1990 |
| JP | 02311824 A2 | 12/1990 |
| JP | 03010222 A2 | 1/1991 |
| JP | 03039932 A2 | 2/1991 |
| JP | 04057024 A2 | 2/1992 |
| JP | 04057025 A2 | 2/1992 |
| JP | 04284423 A2 | 10/1992 |
| JP | 05134257 A2 | 5/1993 |
| JP | 05134258 A2 | 5/1993 |
| JP | 06175136 A2 | 6/1994 |
| JP | 06194513 A2 | 7/1994 |
| JP | 06194662 A2 | 7/1994 |
| WO | WO 92/08978 | 5/1992 |
| WO | WO 99/63329 | 12/1999 |
| WO | WO 99/64862 | 12/1999 |
| WO | WO 01/61325 | 8/2001 |
| WO | WO 01/61357 | 8/2001 |

OTHER PUBLICATIONS

Novak, T. J. et al., "Use of Anistropic Materials as Chemical Detectors," *Analytical Letters*, vol. 5, No. 3, pp. 187–192, 1972, published by Marcel Dekker, Inc. (New York, NY).

Poziomek, E. J. et al., "Use of Liquid Crystals as Vapor Detectors," *Mol. Cryst. Liq. Cryst.*, vol. 27, pp. 175–185, 1973, published by Gordon and Breach Science Publishers, Ltd., (Holland).

Saji, T. et al., "Reversible Formation and Disruption of Micelles by Control of the Redox State of the Head Group," *J. Am. Chem. Soc.*, vol. 107, pp. 6865–6868, 1985, published by the American Chemical Society (Washington, D.C.).

Heslot, F. et al., "Molecular Layering in the Spreading of Wetting Liquid Drops," *Nature*, vol. 338, pp. 640–642, 1989, published by Nature Publishing (New York, NY).

Pieranski P. et al., "Adsorption–Induced Anchoring Transitions at Nematic–Liquid–Crystal–Crystal Interfaces," *Phys. Rev. A.*, vol. 40, No. 1, pp. 317–322, Jul. 1, 1989, published by the American Physical Society (Washington D.C.).

Starkey, C.A. et al. "Evaluation of the Recombigen HIV–1 Latex Agglutination Test," *J. Clin. Microbiol.*, vol. 28, No. 4, pp. 819–822, Apr. 1990, published by the American Society for Microbiology (Washington D.C.).

Parish et al., "A Polyanion Binding Site on the CD4 Molecule, Proximity to the HIV–gp120 Binding Region," *The Journal of Immunology*, vol. 145, No. 4, pp. 1188–1195, Aug. 15, 1990, published by the American Association of Immunologists, Inc. (Bethesda, MD).

Häussling, L. et al. "Biotin–Functionalized Self–Assembled Monolayers on Gold: Surface Plasmon Optical Studies of Specific Recognition Reactions," *Langmuir*, vol. 7, No. 9, pp. 1837–1840, Sep. 1991, published by the American Chemical Society (Washington, D.C.).

Jérôme, B., "Surface Effects and Anchoring in Liquid Crystals," *Rep. Prog. Phys.* vol. 54, pp. 391–452, 1991, published by IOP publishing Ltd. (United Kingdom).

Saji, T. et al., "Formation of Organic Thin Films by Electrolysis of Surfactants with the Ferrocenyl Moiety," *J. Am. Chem. Soc.*, vol. 113, pp. 450–456, 1991, published by the American Chemical Society (Washington D.C.).

Schmitt, F.–J. et al., "Surface Plasmon Studies of Specific Recognition Reactions at Self–Assembled Monolayers on Gold," *Thin Solid Films*, vol. 210/211, pp. 815–817, 1992, published by Elsevier Sequoia.

Charych, D.H. et al., "Direct Colorimetric Detection of a Receptor–Ligand Interaction by a Polymerized Bilayer Assembly", *Science*, vol. 261, pp. 585–588, Jul. 30, 1993, published by the American Association for the Advancement of Science (Washington D.C.).

Cocchi, J.M. et al., "Comparison Between Direct Binding, Competition and Agglutination Assays in the Characterization of Polyclonal Anti–idiotypes Against Anti–HBs Human Monoclonal Antibodies," *J. of Immunological Meth.*, vol. 160, pp. 1–9, 1993, Elsevier Science Publishers.

H. Weetall. "Preparation of Immobilized Proteins Covalently Coupled Through Silane Coupling Agents to Inorganic Supports," *Applied Biochemistry and Biotechnology*, vol. 41, pp. 157–188, 1993, published by Humana Press Inc. (Totowa, NJ).

Kuby, J., *Immunology*, Second Edition (1994), pp. 147–150, W.H. Freeman and Company (New York, NY).

Drawhorn, R. A. et al., "Anchoring of Nematic Liquid Crystals on Self–Assembled Monolayers Formed from Alkanethiols on Semitransparent Films of Gold," *J. Phys. Chem.*, vol. 99, pp. 16511–16515, 1995, published by the American Chemical Society (Washington D.C.).

Gupta, V. K. et al., "Uniform Anchoring of Nematic Liquid Crystals on Self–Assembled Monolayers Formed from Alkanethiols on Obliquely Deposited Films of Gold," *Langmuir*, vol. 12, pp. 2587–2593, 1996; published by American Chemical Society (Washington D.C.).

Gupta, V. K. et al., "Azimuthal Anchoring Transition of Nematic Liquid Crystals on Self–Assembled Monolayers Formed from Odd and Even Alkanethiols," *Physical Review E*, vol. 54, No. 5, pp. R4540–R4543, Nov. 1996, published by The American Physical Society (Washington D.C.).

Yang, H. C. et al., "Molecular Interactions between Organized, Surface–Confined Monolayers and Vapor–Phase Probe Molecules. 8. Reactions between Acid–Terminated Self–Assembled Monolayers and Vapor–Phase Bases," *Langmuir*, vol. 12, pp. 726–735, 1996, published by American Chemical Society (Washington D.C.).

Gallardo, B. S. et al., "Ferrocenyl Surfactants at the Surface of Water: Principles for Active Control of Interfacial Properties," *Langmuir*, vol. 12, pp. 4116–4124, 1996, published by the American Chemical Society (Washington D.C.).

Cornell, B.A. et al., "A Biosensor that uses Ion–Channel Switches," *Nature*, vol. 387, pp. 580–583, Jun. 5, 1997, published by Nature Publishing (New York, NY).

Lin, V. et al., "A Porous Silicon–Based Optical Interferometric Biosensor," *Science*, vol. 278, pp. 840–843, Oct. 31, 1997, published by the American Association for the Advancement of Science (Washington D.C.).

Pan, J. J. et al., "Molecular Recognition and Colorimetric Detection of Cholera Toxin by Poly(diacetylene) Liposomes Incorporating Gm1 Ganglioside," *Langmuir*, vol. 13, No. 6, pp. 1365–1367, 1997, published by the American Chemical Society (Washington D.C.).

Delamarche, E et al., "Patterned Delivery of Immunoglobulins to Surfaces Using Microfluidic Networks," *Science*, vol. 276, pp. 779–781, May 2, 1997, published by the American Association for the Advancement of Science (Washington D.C.).

Gupta, V. K. et al., "Optical Amplification of Ligand–Receptor Binding Using Liquid Crystals," *Science*, vol. 279, pp. 2077–2080, Mar. 27, 1998, published by the American Association for the Advancement of Science (Washington D.C.).

Ricco, A. J., "Surface Acoustic Wave Chemical Sensor Arrays: New Chemically Sensitive Interfaces Combined with Novel Cluster Analysis To Detect Volatile Organic Compounds and Mixtures," *Acc. Chem. Res.*, vol. 31, pp. 289–296, 1998, published by American Chemical Society (Washington D.C.).

Crooks, R. M. et al., "New Organic Materials Suitable for Use in Chemical Sensor Arrays," *Acc. Chem. Res.*, vol. 31, pp. 219–227, 1998, published by American Chemical Society (Washington D.C.).

Xia, Y. et al., "Soft Lithography," *Angew. Chem. Int. Ed.*, vol. 37, pp. 551–575, 1998, published by Wiley Interscience (Germany).

Dancil, K. S. et al., "A Porous Silicon Optical Biosensor: Detection of Reversible Binding of IgG to a Protein A–Modified Surface," *J. Am. Chem. Soc.*, vol. 121 pp. 7925–7930, 1999, published by the American Chemical Society (Washington D.C.).

Naoka, M. et al., "Ferroelectric Liquid Crystal Alignment Films Utilizing Poly (DL amino acids) and Fibrous Proteins," *Kobunshi Ronbunshu*, vol. 56, No. 6, pp. 396–400, Jun. 1999.

Skaife, J. J. et al., "Quantitative Characterization of Obliquely Deposited Substrates of Gold by Atomic Force Microscopy: Influence of Substrate Topography on Anchoring of Liquid Crystals," *Chem. Mater.*, vol. 11, pp. 612–623, 1999, published by American Chemical Society (Washington D.C.).

Shah, R.R. et al., "Using Liquid Crystals to Image Reactants and Products of Acid–Base Reactions on Surfaces with Micrometer Resolution," *J. Am. Chem. Soc.*, vol. 121, pp. 11300–11310, 1999, published by American Chemical Society (Washington D.C.).

Kim, S–R. et al., "Orientations of Liquid Crystals on Mechanically Rubbed Films of Bovine Serum Albumin: A Possible Substrate for Biomolecular Assays Based on Liquid Crystals," *Anal. Chem.*, vol. 72, No. 19, pp. 4646–4653, Oct. 1, 2000, published by the American Chemical Society (Washington D.C.).

Power Point presentation regarding "Optical Detection and Amplification of Biomolecular Interactions Using Liquid Crystals", by Jeff Brake and Nicholas Abbott, dated Apr. 26, 2000. Presented at the University of Wisconsin–Madison, Madison, Wisconsin, on Apr. 26, 2000.

Niculescu, M. et al., "Redox Hydrogel–Based Amperometric Bienzyme Electrodes for Fish Freshness Monitoring," *Anal. Chem.*, vol. 72, pp. 1591–1597, 2000, published by American Chemical Society (Washington D.C.).

Shah, R. R. et al., "Coupling of the Orientations of Liquid Crystals to Electrical Double Layers Formed by the Dissociation of Surface–Immobilized Salts," *J. Phys. Chem. B*, vol. 105, pp. 4936–4950, 2001, published by American Chemical Society (Washington D.C.).

Abbott, N. L. et al., "Imaging of Adsorption and Self–Organization of Amphiphiles at Aqueous–Liquid Crystals Interfaces," American Chemical Society Book of Abstracts, 221st National Meeting, Apr. 1–5, 2001.

Abbott, N. L., "Biophotonics based on Liquid Crystals: Development of New Principles Suitable for Profiling of Regulatory Signaling Proteins," Oral Presentation of LEOS Annual Meeting, Nov. 12, 2001, San Diego, California.

Tingey, M. L. et al., "Orientations of Liquid Crystals on Chemically functionalized Surfaces That Possess Gradients in Nanometer–Scale Topography," *Adv. Mater.*, vol. 14, No. 17, Sep. 3, 2002, published by Wiley–VCH Verlag GmbH & Co. KgaA, Winheim, Germany.

Luk, Y–Y et al., "Using Liquid Crystals and Nanostructured Surfaces to Assay for Regulatory Proteins Involved in Cell Signaling Pathways," Abstract No. 199 for presentation of $76^{th}$ Colloid and Surface Science Symposium, Jun. 23–26, 2002, University of Michigan, Ann Arbor, Michigan.

Shah, R, R., et al., "Principles for measurement of Chemical Exposure Based on Recognition–Driven Anchoring Transitions in Liquid Crystals," *Science*, vol. 293, pp. 1296–1299, Aug. 17, 2001; published by the American Association for the Advancement of Science (Washington D.C.).

Skaife, J.J., et al., "Influence of Nanometer–Scale Topography of Surfaces on the Orientational Response of Liquid Crystals to Proteins Specifically Bound to Surface–Immobilized Receptors," *Langmuir*, vol. 17, No. 18, pp. 5448–5457, Aug. 11, 2001, published by the American Chemical Society. (Washington D.C.).

* cited by examiner

56°  63°

56°  63°

SURFACES WITH GRADIENTS IN SURFACE TOPOGRAPHY

CROSS-REFERENCES TO RELATED APPLICATIONS

This application claims priority to U.S. Provisional Application No. 60/425,132 titled "Surfaces with Gradients in Surface Topography," filed Nov. 8, 2002, the entire disclosure of which is incorporated herein by reference and for all purposes.

GOVERNMENT RIGHTS

This invention was made with United States government support awarded by the following agency: NSF 0079983. The United States has certain rights in this invention.

FIELD OF THE INVENTION

The invention relates generally to devices and surfaces with gradients in surface topography and to methods for producing such surfaces. The invention also relates to methods for optimizing performance of liquid crystal assay devices and for devices prepared using such methods.

BACKGROUND OF THE INVENTION

Recently, various assay devices that employ liquid crystals have been disclosed. For example, a liquid crystal assay device using mixed self-assembled monolayers (SAMs) containing octanethiol and biotin supported on an anisotropic gold film obliquely deposited on glass has been reported. Gupta, V. K.; Skaife, J. J.; Dubrovsky, T. B., Abbott N. L. Science, 279, (1998), pp. 2077–2079. In addition, PCT publication WO 99/63329 published on Dec. 9, 1999, discloses assay devices using SAMs attached to a substrate and a liquid crystal layer that is anchored by the SAM. U.S. Pat. No. 6,288,392 issued to Abbott et al. discloses the quantitative characterization of obliquely-deposited substrates of gold using atomic force microscopy and describes the influence of substrate topography on the anchoring of liquid crystals. U.S. Pat. No. 6,284,197 issued to Abbott et al. discloses the optical amplification of molecular interactions using liquid crystals. As disclosed by U.S. Pat. No. 6,284,197, interactions between molecules that are components of self-assembled monolayers and other molecules can be amplified and transduced into an optical signal through the use of a mesogenic layer. A device for detecting analytes is disclosed which includes a substrate onto which a self-assembled monolayer is attached and a mesogenic layer which is anchored by the self-assembled monolayer. The mesogenic layer undergoes a change in conformation in response to the molecular interaction.

Various other assay devices that employ liquid crystals have been disclosed. For example, U.S. Ser. No. 09/784,679 published on May 9, 2002, as U.S. Patent Publication No. U.S. 2002/0055093, discloses a rubbed substrate structure for use in a liquid crystal assay device. The rubbed substrate structure includes a biochemical blocking compound and a biomolecule recognition agent. The surface of the side of the support containing the biochemical blocking layer is rubbed such that it possesses features that drive the uniform anchoring of liquid crystals when the liquid crystals contact the side of the support containing the biochemical blocking layer. U.S. Ser. No. 09/784,232 published on Mar. 7, 2002, as U.S. Patent Publication No. U.S. 2002/0028451, discloses a method and apparatus for detection of microscopic pathogens. The detection apparatus includes a substrate with a detection region on a surface thereof, the detection region having microstructures including grooves formed therein that will align liquid crystal material in contact therewith. The detection apparatus also includes a blocking layer on the surface of the detection region of the substrate that does not disrupt the alignment of liquid crystal material in contact therewith. The blocking layer blocks nonspecific adsorption of pathogens to the surface, but a binding agent on the surface of the detection region of the substrate specifically binds to a selected pathogen.

As noted above, various liquid crystal assay devices have been reported that employ self-assembled monolayers formed on metallized surfaces. A need remains, however, for surfaces that possess gradients in surface topography and a method for forming and using such surfaces. A need also remains for a method of optimizing sensitivity and performance in liquid crystal assay devices that utilizes self-assembled monolayers formed on metallized surfaces.

SUMMARY OF THE INVENTION

The present invention provides surfaces that provide gradients in surface topography and methods for forming such surfaces. The invention also provides methods for optimizing the performance of liquid crystal assay devices and methods for determining the optimum angle for deposition of a metal in forming a metallized surface for use in forming a liquid crystal assay device.

A method for preparing a surface possessing gradients in surface topography is provided. The method includes obliquely depositing a metal from a metal source onto a surface of a support. The surface of the support includes a first end, a second end, and a region between the first and second ends. The second end of the surface is located nearer to the metal source than is the first end, and the metal is deposited onto the first end of the surface at a first angle of incidence and the metal is deposited onto the second end of the surface at a second angle of incidence. The first angle of incidence is greater than the second angle of incidence, and the metal is deposited onto the region between the first and second ends at angles of incidence that vary from the first angle of incidence to the second angle of incidence over the region to produce the metallized surface with gradients in surface topography. The angles of incidence are measured from the normal of the support. In some preferred embodiments, the metal is obliquely deposited from a metal source onto the surface of the support using an electron-beam evaporator.

In some embodiments of the method for preparing a surface possessing gradients in surface topography, the difference between the first angle of incidence and the second angle of incidence is at least 3°, is at least 5°, is at least 8°, or is at least 10°.

In some embodiments of the method for preparing a surface possessing gradients in surface topography, the metal source is located in a crucible having a top surface, and the support is planar and perpendicularly disposed with respect to the top surface of the crucible.

In some embodiments of the method for preparing a surface possessing gradients in surface topography, the distance between the second end of the support and the metal source is less than 35 cm, is less than 30 cm, or is less than 25 cm.

In other embodiments of the method for preparing a surface possessing gradients in surface topography, the support is a glass slide that, in some embodiments, has a length of at least 7 cm. In other embodiments, the support is a silica wafer.

In still other embodiments of the method for preparing a surface possessing gradients in surface topography, the metal obliquely deposited onto the support is gold or silver.

In still other embodiments of the method for preparing a surface possessing gradients in surface topography, the support comprises a layer of titanium and the metal is obliquely deposited onto the layer of the titanium. In some such embodiments the support comprises a glass slide onto which a layer of titanium has been obliquely deposited. In some such methods, the layer of titanium is deposited at an angle of incidence that is approximately the same over the support and then a metal such as gold or silver is obliquely deposited onto the titanium. In other methods, the titanium is deposited onto the support according to the method of the invention so that the deposited titanium forms a metallized surface that possesses gradients in surface topography and then a metal such as gold or silver is deposited over the titanium according to the methods of the invention.

In still other embodiments of the method for preparing a surface possessing gradients in surface topography, the metal obliquely deposited onto the support is gold or silver and the method further includes forming a self-assembled monolayer on the metallized surface. In some such methods, the self-assembled monolayer is formed on the metallized surface by contacting a solution of an alkanethiol with the metallized surface. In some such embodiments, the method further includes contacting the self-assembled monolayer with a liquid crystal. In some such embodiments, the liquid crystal is 4-cyano-4'-pentylbiphenyl.

In one aspect, the invention further provides any of the surfaces with gradients produced by any of the methods of the invention.

In another aspect, the invention provides a substrate possessing gradients in surface topography. The substrate includes: a support having a first end, a second end, and a region between the first end and the second end; a metallized surface disposed over the support, wherein the metallized surface includes a layer of metal with a surface topography that includes repeating hills and valleys, wherein the metallized surface includes a gradient wherein the layer of metal is thicker at the second end than it is at the first end and gradually changes in the region between the first end and the second end, and further wherein the hills are higher and the valleys are deeper at one end than they are at the other end and the height of the hills and the depth of the valleys gradually changes in the region between the first end and the second end of the support; an optional adhesion promoting material disposed between the metallized surface and the support; and a self-assembled monolayer or a layer of protein attached to a top surface of the metallized surface. In some embodiments, the anchoring energy of a liquid crystal disposed over the metallized surface varies across the surface from the first end of the support to the second end of the support, wherein an analyte bound to the surface will disrupt the uniform alignment of the liquid crystal on regions of the surface with low anchoring energies, but will not disrupt the alignment of the liquid crystal on regions of the surface that possess high anchoring energies. In some such embodiments, a liquid crystal disposed on the metallized surface will be oriented in one direction at the first end of the support and will be oriented in a different direction at the second end of the support. In some such embodiments, the orientation of the liquid crystal at the first end of the support is perpendicular to the orientation of the liquid crystal at the second end of the support. In other embodiments, a liquid crystal disposed on the metallized surface will be uniformly oriented at either the first end or the second end of the support and will not be uniformly oriented at the other end of the support. In some embodiments, the support is planar, and in some such embodiments, the support is a glass slide which, in some embodiments, has a length of at least 7 cm. In some embodiments the metal of the metallized surface is gold or silver.

In some embodiments, the substrate further includes a liquid crystal that is disposed above the self-assembled monolayer or the layer of protein. In some such embodiments, the liquid crystal is 4-cyano-4'-pentylbiphenyl.

In other embodiments, the self-assembled monolayer includes an alkanethiol that is bound to the metallized surface of the substrate.

In yet other embodiments, the substrate includes the optional adhesion promoting material disposed between the metallized surface and the support of the substrate. In some such embodiments, the adhesion promoting material is a layer of titanium deposited on the support. In some such embodiments, the layer of titanium has a gradient in topography that extends from the first end of the support to the second end of the support.

A method for determining an optimal angle of metal deposition for a metallized surface in a liquid crystal assay device is also provided. The method includes:

(a) contacting a liquid crystal with a receptor molecule disposed on a first metallized surface of a first support in a first liquid crystal cell, the first liquid crystal cell comprising a first surface and a second surface, the second surface comprising the receptor molecule disposed on the first metallized surface of the first support, wherein the first surface and the second surface are spaced apart facing each other in the first liquid crystal cell, further wherein the first support of the second surface comprises a first end, a second end, and a region between the first and second ends, wherein the first metallized surface of the first support comprises a first gradient in surface topography formed by obliquely depositing a metal on the first support at angles of incidence varying from a first angle of incidence at the first end of the first support to a second angle of incidence at the second end of the first support, wherein the difference between the first and second angles of incidence of the first support is at least 3°, and still further wherein the first surface of the first liquid crystal cell is a first surface that uniformly anchors the liquid crystal or is a surface that is substantially the same as the second surface;

(b) contacting the liquid crystal with a receptor-analyte complex molecule disposed on a second metallized surface of a second support in a second liquid crystal cell, wherein the receptor-analyte complex molecule is formed by reaction of the receptor molecule with an analyte molecule that binds to the receptor molecule, and the second liquid crystal cell comprises a third surface and a fourth surface, the fourth surface comprising the receptor-analyte complex molecule disposed on the second metallized surface of the second support, wherein the third surface and the fourth surface are spaced apart facing each other in the second liquid crystal cell, further wherein the second support of the fourth surface comprises a third end, a fourth end, and a region between the third and fourth ends, wherein the second metallized surface of the second support comprises a second gradient in surface topography formed by obliquely depositing the metal on the second support at angles of incidence varying from a third angle of incidence at the third end of the second support to a fourth angle of incidence at the fourth end of the second support, wherein the difference between the third and fourth angles of incidence of the second support is substantially the same as the difference between the first and second angles of incidence of the first support, and further wherein the first angle of incidence is substantially the same as the third angle of incidence and the second angle of incidence is substantially the same as the fourth angle of incidence such that the first metallized surface is substantially the same as the second metallized surface, further wherein the angles of incidence are all measured from the normal, and still further wherein the third surface of the second liquid crystal cell is a second surface that uniformly anchors the liquid crystal or is a surface that is substantially the same as the fourth surface;

(c) comparing at least one optical property of the liquid crystals in the first and second liquid crystal cells; and (d) determining the angle of incidence that maximizes the difference in the at least one optical property of the liquid crystals in the first and second liquid crystal cells.

In some embodiments of the method for determining the optimal angle of metal deposition, the difference between the first and second angles of incidence of the first support is at least 5°, is at least 8°, or is at least 10°.

In other embodiments of the method for determining the optimal angle of metal deposition, the metal is silver or gold. In some such embodiments, the gold or silver is obliquely deposited on a layer of titanium or other adhesion promoting material.

In other embodiments of the method for determining the optimal angle of metal deposition, the first surface of the first liquid crystal cell is a first surface that uniformly anchors the liquid crystal and the third surface of the second liquid crystal cell is a second surface that uniformly anchors the liquid crystal and the first surface and the third surfaces comprise glass slides with a surface comprising obliquely deposited gold. In yet other embodiments, the first surface of the first liquid crystal cell is a surface that is substantially the same as the second surface and the third surface of the second liquid crystal cell is a surface that is substantially the same as the fourth surface In other embodiments of the method for determining the optimal angle of metal deposition, the at least one optical property of the liquid crystals compared in the first and second liquid crystal cells comprises is luminance.

In other embodiments of the method for determining the optimal angle of metal deposition, the angle of incidence that maximizes the difference in the at least one optical property of the liquid crystals in the first and second liquid crystal cells is determined by measuring the standard deviation in the luminance of the liquid crystal in the first and second liquid crystal cells at an orientation of 45° or is determined by measuring the difference in luminance between orientations of 0° and 45°.

In other embodiments of the method for determining the optimal angle of metal deposition, the receptor is selected from a protein, an immunoglobulin, a portion of an immunoglobulin, a peptide, a polypeptide, a carbohydrate, a fragment of RNA, and a fragment of DNA.

The invention further provides an alternative embodiment of the method for determining the optimal angle of metal deposition. In the alternative embodiment, the first surface that uniformly anchors the liquid crystal in the first liquid crystal cell is replaced by a surface that is substantially the same as the second surface that comprises the receptor molecule disposed on the first metallized surface of the first support. In such an embodiment, the third surface that uniformly anchors the liquid crystal in the second liquid crystal cell is replaced by a surface that is substantially the same as the fourth surface that comprises the receptor-analyte complex molecule disposed on the second metallized surface of the second support.

The invention further provides a surface that includes a metallized surface formed by obliquely depositing a metal such as gold or silver at the optimal angle determined by the method of the invention and the receptor molecule disposed thereon. Such surfaces may be formed by obliquely depositing the metal on a support such as a glass slide.

Further objects, features and advantages of the invention will be apparent from the following detailed description when taken in conjunction with the accompanying drawings.

DETAILED DESCRIPTION OF THE INVENTION

Figure 1:
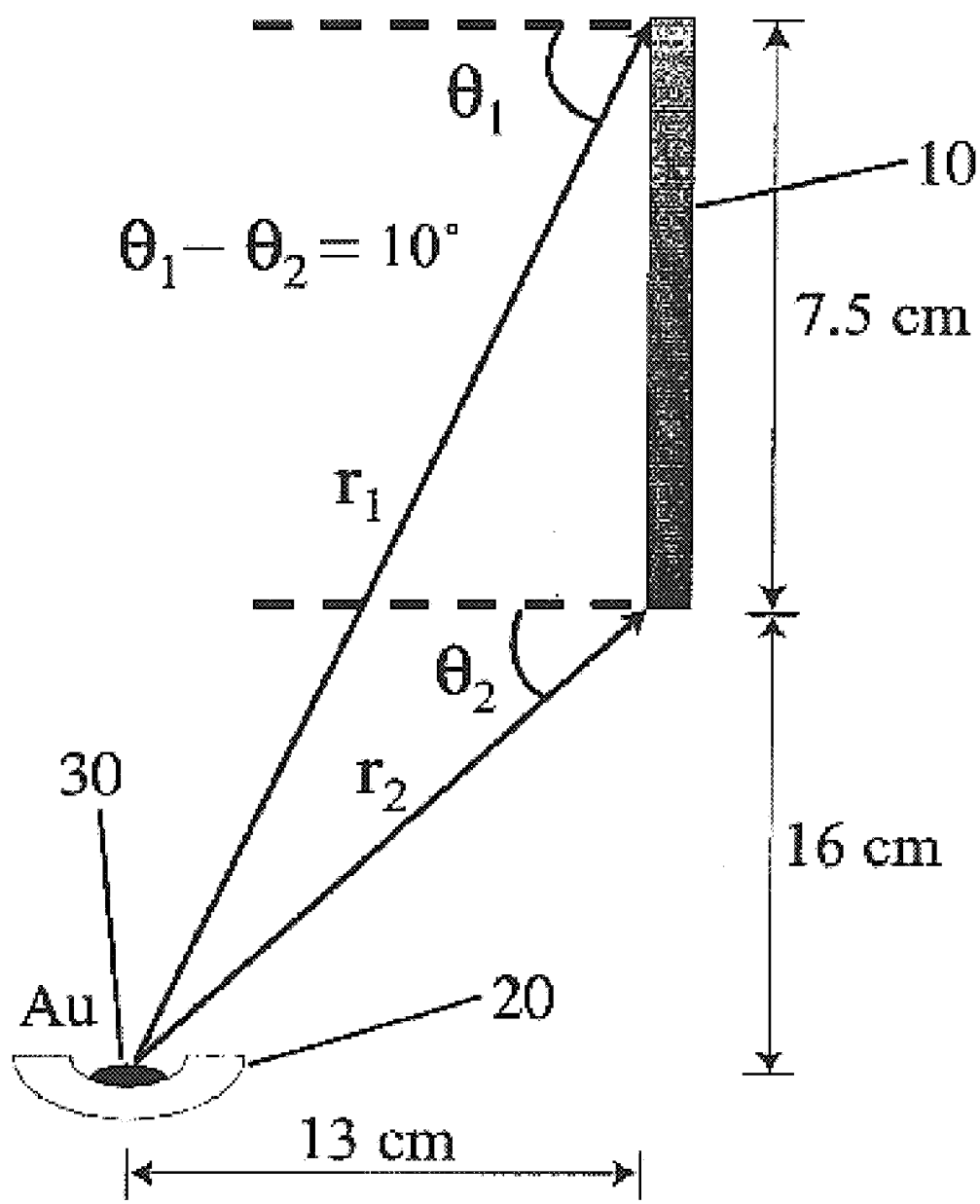
FIG. 1 is a schematic representation showing how a metal such as gold, silver, titanium, and the like is deposited on a glass surface to create a surface with gradients in nanometer-scale surface topography.

As used herein, the phrase "angle of incidence" refers to the angle between the ray striking the surface of a support and the normal to the support. In FIG. 1, the angles represented as $\theta_1$ and $\theta_2$ are the angles of incidence for rays $r_1$ and $r_2$, respectively.

The term "about" as used herein in conjunction with a number refers to a range of from 95% to 105% of that number. For example, an angle of about 60° refers to an angle ranging from 57° to 63°.

The phrase "substantially the same" as used herein in comparing two or more objects or items, means that the objects or items function in the same manner under the same conditions.

All ranges recited herein include all combinations and subcombinations included within that range's limits. For example, a range of from about 48° to about 58° includes ranges of from 48° to 58°, of from 50° to 55°, of from 48° to 56°, and of from 50° to 56°, etc. Similarly, a thickness range of from about 13 nm to about 7 nm includes ranges of from 13 nm to 7 nm, of from 12 nm to 8 nm, of from 13 nm to 9 nm, and of from 12 nm to 7 nm, etc. Furthermore, one skilled in the art will recognize that any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third.

Generally, the invention provides metallized surfaces possessing gradients in nanometer-scale topography and methods for producing such surfaces. Such surfaces may include self-assembled monolayers or a layer of a protein disposed over the metallized surface and may further include a liquid crystal deposited over the self-assembled monolayer or the protein. The metallized surfaces possessing gradients in surface topography may be used to determine the optimal angle of incidence that should be used to prepare a metallized surface for use in a liquid crystal assay device. Therefore, the invention also generally provides methods for optimizing liquid crystal devices using surfaces with gradients in nanometer-scale topography.

Figure 2:
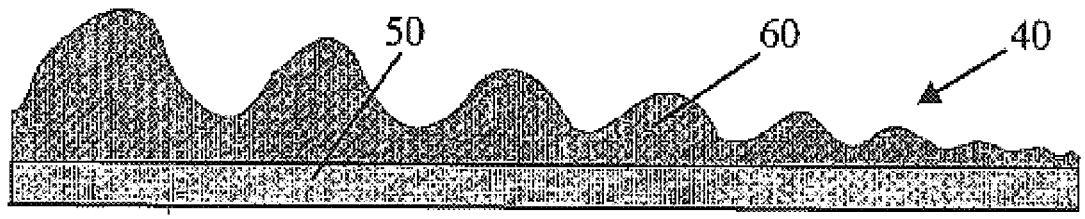
FIG. 2 is a schematic representation of a substrate with a glass slide and a metallized surface having gradients in amplitude, wavelength, and metal thickness across the surface.

FIG. 1 is a schematic representation (not to scale) showing how a surface possessing continuous gradients in surface topography may be fabricated from a support 10 such as a glass slide with a length of 7.5 cm. FIG. 1 is representative and is not intended to limit the invention in any manner. As shown in FIG. 1, a support 10 such as a glass slide may be positioned perpendicular to the top surface of a crucible 20 which holds a suitable metal 30 such as, but not limited to, gold or silver. As shown in FIG. 1, support 10 is horizontally displaced 13 cm from the center of crucible 20 and is vertically displaced 16 cm above the top surface of crucible 20. In FIG. 1, $r_1$ represents a ray of metal vapor impacting support 10 at a first end of support 10 which is situated furthest from metal 30 (vertically positioned 23.5 cm above the top surface of crucible 20) and $r_2$ represents a ray of metal vapor impacting support 10 at a second end of support 10 situated nearest metal 30 (vertically positioned 16 cm above the top surface of crucible 20). The angle of incidence for $r_1$ is depicted as $\theta_1$ (measured from the normal), and the distance from metal 30 to the surface of support 10 at the first end is about 26.9 cm at the point where $r_1$ impacts the surface of support 10 as can be readily calculated using the Pythagorean theorem. The angle of incidence for $r_2$ is depicted as $\theta_2$ (measured from the normal), and the distance from metal 30 to the surface of support 10 at the second point is about 20.6 cm at the point where $r_2$ impacts the surface of support 10. For the particular geometry shown in FIG. 1, the angle of incidence changes by about 10° (first angle of incidence minus the second angle of incidence or $\theta_1-\theta_2\approx10°$) from one end of support 10 to the other. In various embodiments, the difference between the first angle of incidence and the second angle of incidence is at least 3°, is at least 5°, is at least 7°, is at least 8°, or is at least 10° such as shown in FIG. 1. By locating support 10 close to the metal 30 source, the oblique angle of deposition on the substrate gradually and continuously changes from $\theta_1$ to $\theta_2$ as shown in FIG. 1. Such changes in the angle of incidence over the surface of a support 10, such as a glass slide, forms a surface 40 with a continuous and gradual gradient in surface topography, such as shown in FIG. 2 where the metal 60 is deposited over glass slide 50.

The roughness and the anisotropy of the surface formed at the larger angle of deposition ($\theta_1$, the first angle of incidence) is greater than the roughness and anisotropy of the surface formed at the smaller angle of deposition ($\theta_2$, the second angle of incidence). The change in the roughness and the anisotropy of the surface between $\theta_1$ and $\theta_2$ is gradual and continuous as illustrated in the schematic representation shown in FIG. 2. The variation in the angle of metal deposition across the length of the support or substrate follows an arctan relationship where the support is perpendicularly disposed to the top surface of the crucible:

$$\theta = \arctan(x/y + z/y)$$

where
- x is the distance between the end of the support closest to the source of the metal and the portion of the support that $\theta$ is calculated for (0 to 7.5 cm for the particular support 10 shown in FIG. 1);
- y is the distance the support is horizontally displaced from the center of the crucible or metal source (13 cm for the geometry of the support 10 shown in FIG. 1); and
- z is the distance that the support is vertically displaced from the top surface of the crucible or metal source (16 cm for the geometry of the support 10 shown in FIG. 1).

Figure 4:
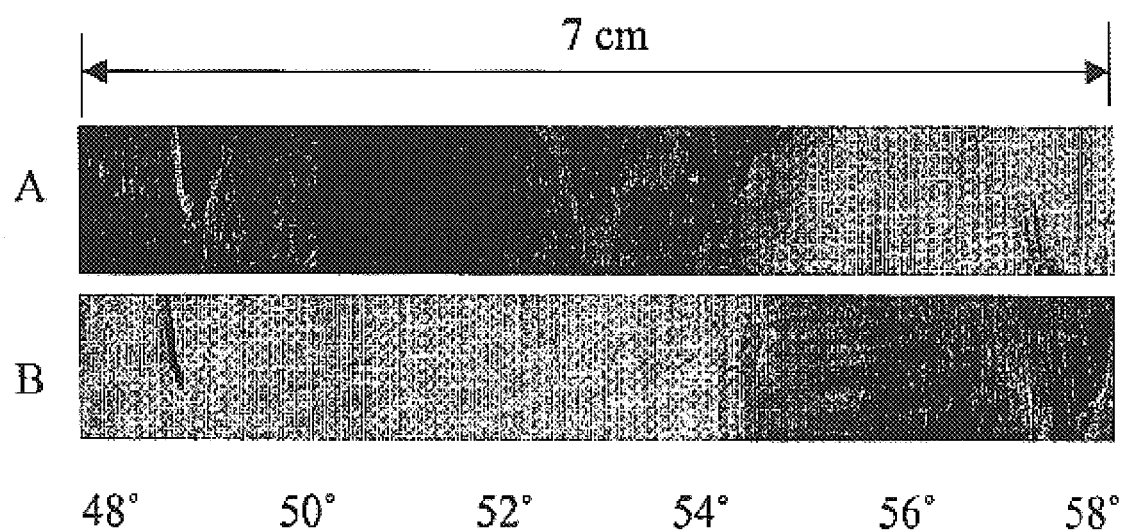
FIG. 4 is a scanned image of the optical appearance of a liquid crystal (4-cyano-4'-pentylbiphenyl (5CB)) sandwiched between two gold films supporting self-assembled monolayers (SAMs) formed from hexadecanethiol where the top surface includes a gold film deposited at an angle of incidence of 40° and the bottom surface includes a gold film deposited at an angle of incidence that changes from 48° to 58° across the length of the slide (thickness of gold ranging from about 23 nm (at 48°) to about 11 nm (at 58°). The slide is oriented (long axis) parallel to the polarizer of the microscope. The top image (A) is the image viewed through cross polars, and the bottom image (B) is the image viewed through parallel polars.
Figure 5:
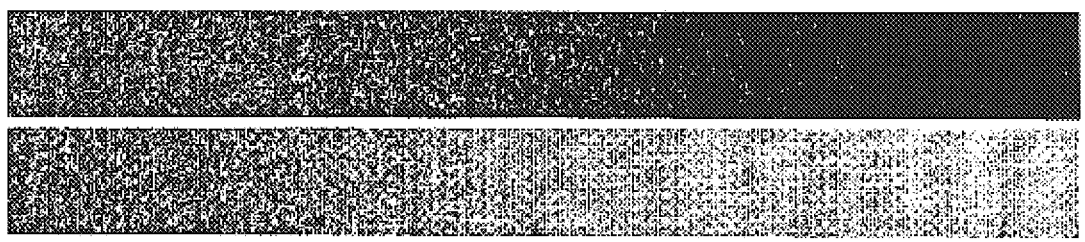
FIG. 5 is a scanned image viewed through cross polars of the optical appearance of 5CB on a layer of bovine serum albumin (BSA) supported on a SAM formed from hexadecanethiol on a gold film of a slide where the gold is deposited on the slide at an angle of incidence that ranged from 56.5° to 63.5° across the length of the slide (thickness of gold ranging from about 13 nm to about 7 nm). The top image shows the entire length of the slide when it is oriented (long axis) parallel to the polarizer of the microscope, and the bottom image shows the entire length of the slide when it is oriented at an angle of 45° to the polarizer of the microscope.
Figure 6:
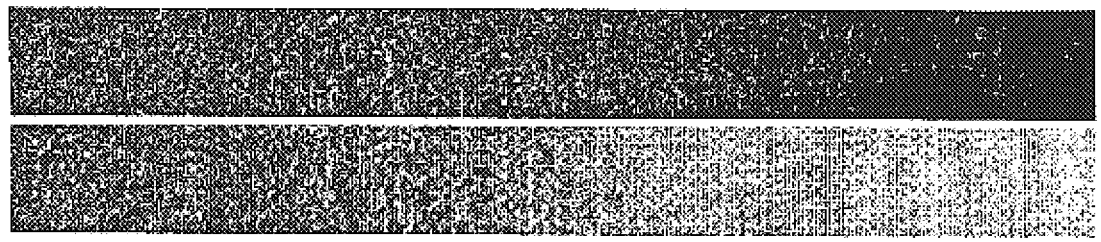
FIG. 6 is a scanned image viewed through cross polars of the optical appearance of 5CB on a layer of BSA/anti-BSA supported on a SAM formed from hexadecanethiol on a gold film of a slide where the gold is deposited on the slide at an angle of incidence that ranged from 56.5° to 63.5° across the length of the slide (thickness of gold ranging from ~13 nm to ~7 nm). The top image shows the entire length of the slide when it is oriented (long axis) parallel to the polarizer of the microscope, and the bottom image shows the entire length of the slide when it is oriented at an angle of 45° to the polarizer of the microscope.

According to the above equation and the particular deposition geometry shown in FIG. 1, $\theta_1=\arctan(7.5/13+16/13)\approx61°$ and $\theta_2=\arctan(0/13+16/13)\approx51°$, and $\theta_1-\theta_2\approx10°$. The configuration used for deposition may be altered to obtain desired $\theta_1$ and $\theta_2$ values. Additionally, the deposition configuration may be altered to obtain a desired $\theta_1-\theta_2$ range. Furthermore, longer or shorter supports may be used to increase or decrease the range in the angles of incidence over the support. In one embodiment of the invention, the difference between the first angle of incidence ($\theta_1=58°$) and the second angle of incidence ($\theta_2=48°$) is about 10° as shown in FIG. 4. In another embodiment, the difference between the first angle of incidence ($\theta_1=63°$) and the second angle of incidence ($\theta_2=56°$) is about 7° as shown in FIGS. 5 and 6. Because the variation in the angle of deposition across the length of the support follows an arctan relationship and is close to linear for supports in which x ranges from 0 to 7.5 cm, the change in the gradient of the roughness and anisotropy across the substrate is also close to linear for such systems. The gradient in topography can be used to report multiple protein binding events in biological assays and can also be used to identify optimal topography for detection of a given bind event using liquid crystals.

Figure 3:
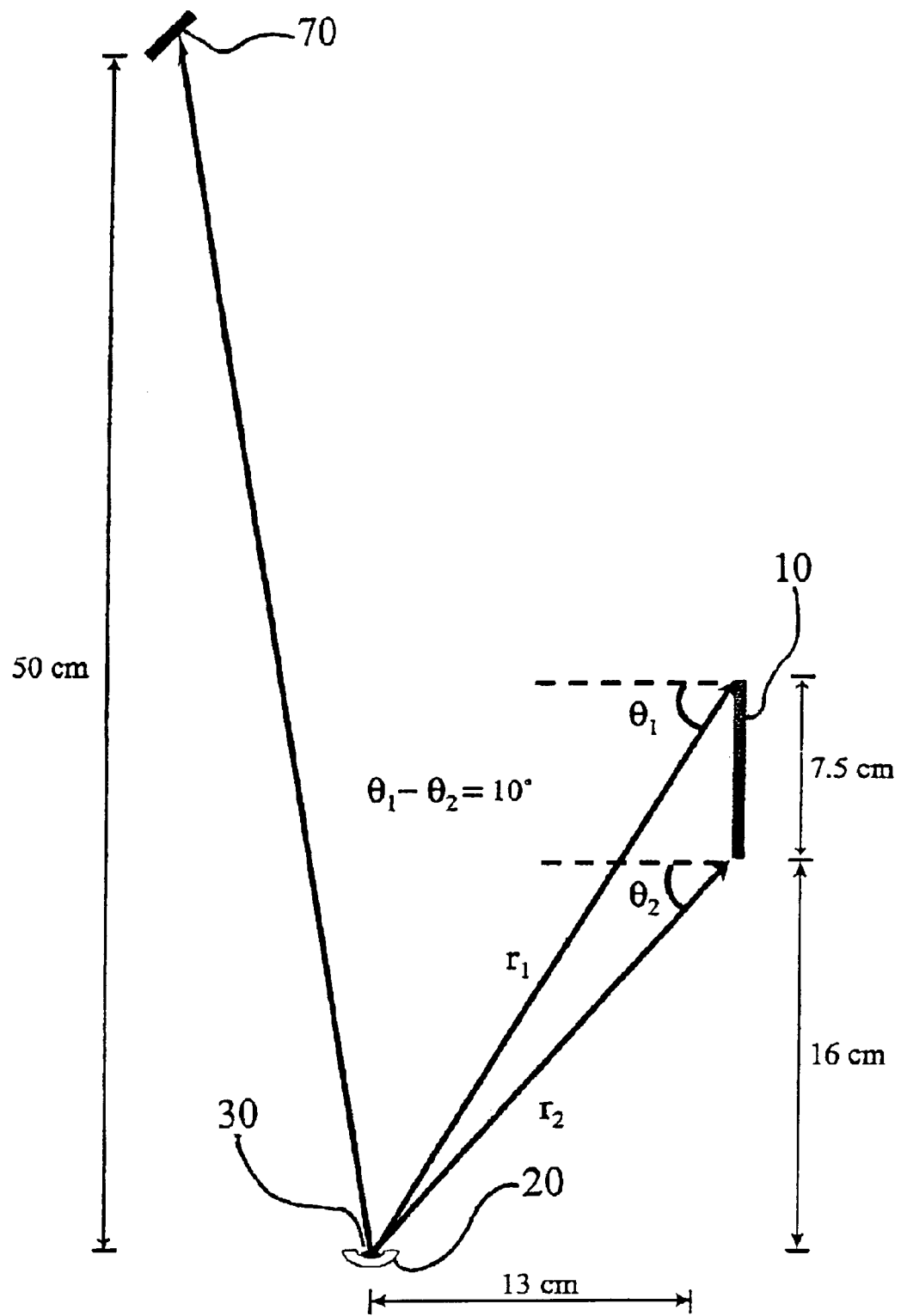
FIG. 3 is a schematic diagram comparing gold deposition on a glass microscope slide vertically displaced 50 cm from the gold source and gold deposition on a glass microscope slide (7.5 cm) vertically displaced 16 cm from the gold source at its nearest.

FIG. 3 is a schematic representation comparing the geometry for fabricating a surface possessing continuous gradients in surface topography with the geometry for fabricating a surface with uniform surface topography. As shown in FIG. 3, a metallized surface possessing gradients in surface topography, may be fabricated from a support 10 such as a glass slide with a length of 7.5 cm that is vertically displaced 16 cm from a source of metal and is horizontally displaced 13 cm from a source of metal (See FIG. 1). FIG. 3 is representative and is not intended to limit the invention in any manner. As shown in FIG. 3, support 10 is located close (16 cm above) to the metal 30 source in crucible 20 in the one geometry similar to that shown in FIG. 1. Thus, the angle of incidence of metal deposition on the support gradually and continuously changes from $\theta_1$ to $\theta_2$ over the support as described above with respect to FIG. 1. In contrast, in conventional geometries used in oblique metal deposition, a support 70 is located at a distance further (e.g., 50 cm) from the metal 30 and crucible 20 and at an angle to the surface of the crucible such that the angle of incidence does not change appreciably over the surface of the support. This latter conventional geometry does not provide surfaces with gradients in surface topography. Rather, it provides surfaces with a uniform anisotropic topography. See Gupta, V. K. et al., Chemistry of Materials, 8, (1996), p. 1366, for a general description of oblique deposition methodology.

In some embodiments, a layer of an obliquely deposited metal, preferably gold, is deposited on a cleaned surface of a support by evaporating it at a rate of about 0.2 Å/s (0.02 nm/s) at a pressure of less than or about $5 \times 10^{-6}$ torr without rotation of the sample relative to the incident flux of gold. In other embodiments, a metal such as gold is deposited in accordance with the invention on a top surface of a support that contains an adhesion-promoting material such as titanium. A support with a metal adhesion-promoting material such as titanium may be formed by depositing the titanium on the support using conventional deposition techniques such that the support includes a top layer of titanium without gradients in surface topography prior to deposition of the metal such as gold or silver. Alternatively, a support with a metal adhesion-promoting material such as titanium may be formed using the methodology of the invention such that the support includes a top layer of titanium that itself possesses a gradient in surface topography prior to deposition of the other metal according to the methods of the invention. The layer of a metal such as gold on the metallized surface of the support typically has an average thickness that ranges from 5 nm or about 5 nm to 30 nm or about 30 nm. In other embodiments, the average thickness of the layer of a metal such as gold deposited on the surface of the support ranges from 8 nm or about 8 nm to 25 nm or about 25 nm in thickness or from 9 nm or about 9 nm to 20 nm or about 20 nm in thickness. In still other embodiments, the layer of the metal such as gold deposited on the support has an average thickness that ranges from 10 nm or about 10 nm to 20 nm or about 20 nm. In some embodiments, the thickness of the metal at the end of the support nearest the metal source during deposition ranges from about 12 nm to about 25 nm or from about 13 nm to about 23 nm. In some embodiments, the thickness of the metal deposited on the end of the support furthest from the metal source ranges from 5 nm to 12 nm or from 7 nm to 11 nm. In one embodiment, the thickness of the deposited metal at one end of the support ranges from 5 nm to 9 nm and the thickness of the metal deposited at the other end of the support ranges from 11 nm to 15 nm. In one such embodiment, the thickness of the deposited metal at one end of the support is 7 nm or about 7 nm and the thickness of the metal deposited at the other end of the support ranges from 13 nm or about 13 nm. In other embodiments, the thickness of the deposited metal at one end of the support ranges from 9 nm to 13 nm and the thickness of the metal deposited at the other end of the support ranges from 20 nm to 25 nm. In some such embodiments, the thickness of the deposited metal at one end of the support is 11 nm or about 11 nm and the thickness of the metal deposited at the other end of the support ranges from 23 nm or about 23 nm. The metallized surface obtained after deposition of the metal is generally an anisotropically rough and semi-transparent surface that possesses gradients in nanometer-scale topography.

A wide variety of materials may be used as supports in preparing surfaces with gradients in surface topography according to the methods of the present invention. Generally, supports are planar, although this is not required in the present invention. Preferred supports include polymers and silica-containing materials. Examples of polymeric supports include, but are not limited to, polystyrene, polycarbonates, and polymethyl methacrylate. Other materials suitable for use as supports include metal oxides such as, but not limited to, indium oxide, tin oxide, and magnesium oxide and metals such as, but not limited to, gold, silver, and platinum. Still other materials that may be used as supports include cellulosic materials such as nitrocellulose, wood, paper, and cardboard, and sol-gel materials. In some preferred embodiments, supports include glass, quartz, and silica, or more preferably, glass slides, glass plates, and silica wafers. Preferably, such supports are cleaned prior to use. For example, in one method, glass slides or plates are preferably cleaned by treatment in "piranha solution" (70% $H_2SO_4$/30% $H_2O_2$) for 1 hour and then rinsed with deionized water before drying under a stream of nitrogen. "Piranha solution" requires care in handling as it reacts violently with organic compounds and should not be stored in closed containers.

Metals suitable for use in preparing metallized surfaces possessing gradients in nanometer-scale topography include, but are not limited to, gold, silver, copper, platinum, and palladium. As described above, optionally, an obliquely deposited metal surface possessing gradients in surface topography such as a gold or silver surface with gradients in surface topography will overlay a surface of titanium or other material that promotes adhesion which has already been deposited on a top surface of the support. The use of the titanium provides better adhesion of the obliquely deposited metal such as silver, or more preferably gold in preparing the metallized surface. Chromium and organic adhesion promoters, such as, but not limited to, aminopropyltrialkoxysilanes may also be utilized in accordance with the present invention. The use of titanium or another adhesion-promoting material is not required as suitable metallized surfaces with gradients in surface topography may be prepared without the use of such materials. If an adhesion promoting material is used, a layer of varying thickness may be applied to the underlying support. In some embodiments, approximately 1 nm of Ti is deposited on a support such as a glass slide or plate at uniform or roughly uniform angles of incidence so that the titanium on the support has a uniform surface topography. In other embodiments, the amount of adhesion-promoting material ranges from 0.5 nm or about 0.5 nm to 2.0 nm or about 2.0 nm while in other embodiments the thickness ranges from 0.8 nm or about 0.8 nm to 1.5 nm or about 1.5 nm. In some embodiments, approximately 1.0 nm of aminopropyltrimethoxy-silane is deposited as an adhesion-promoting material. In other embodiments, the thickness of the layer of adhesion promoting material ranges from 0.5 nm or about 0.5 nm to 5 nm or about 5 nm. The amount of adhesion-promoting material may be thicker such that in some embodiments, the thickness of the layer of an adhesion-promoting material such as titanium ranges from 0.5 nm or about 0.5 nm to 10 nm or about 10 nm.

Self-assembled monolayers may be formed on metallized surfaces possessing gradients in surface topography and may be formed on metallized surfaces with a surface topography that has been optimized, according to the present invention, for use in a specific liquid crystal detection device or application. This is typically accomplished by immersing the support with the metallized surface in a solution containing the alkanethiol. Alternatively, a solution may be dropped or poured onto the surface or otherwise contacted with the surface of the support containing the metal. Functional groups such as the thiol (—SH) group of the alkanethiol bind to the metal of the metallized surface immobilizing the alkanethiol on the surface and forming the self-assembled monolayer. As noted above, the alkanethiol is adsorbed onto the surface of the support from a solution containing the alkanethiol. In some embodiments, the alkanethiol is present in an alcohol such as ethanol or methanol although other liquids may also be employed in accordance with the invention.

Various alkanethiols may be used to prepare self-assembled monolayers on the surfaces with gradients in nanometer-scale topography or on surfaces with optimized surface topography of the present invention. Suitable alkanethiols include, but are not limited to, $C_4$ to $C_{20}$ alkanethiols such as butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, and eicosanethiol. In various embodiments, the alkanethiols include $C_{10}$ to $C_{18}$ alkanethiols, $C_5$ to $C_{12}$ alkanethiols, $C_5$ to $C_{10}$ alkanethiols, $C_5$ to $C_8$ alkanethiols, $C_6$ to $C_{18}$ alkanethiols having an even number of carbon atoms, $C_5$ to $C_{19}$ alkanethiols having an odd number of carbon atoms, hexanethiol, and hexadecanethiol. Those skilled in the art will recognize that dialkyl disulfides, R—S—S—R, may also be used to prepare self-assembled monolayers on surfaces with gradients in nanometer scale topography and on surfaces with optimized surface topography. Omega-functionalized alkanethiols may also be used and are encompassed in the group of compounds referred to as "alkanethiols." For example, mercaptoalkanols such as mercaptohexanol may be used in place of or with an alkanethiol to prepare self-assembled monolayers on the surfaces of the invention. Examples of omega groups in omega-functionalized alkanethiols include hydroxyl such as in mercaptoalkanols, nitriles, carboxylic acids, ethylene oxide, diethylene oxide, triethylene oxide, tetraethylene oxide, pentaethylene oxide, or polyethylene oxide. In some embodiments, the omega group is a hydroxyl group such that the alkanethiol is a mercaptoalkanol that is an alkanethiol with chain lengths ranging from $C_4$ to $C_{20}$.

Self-assembled monolayers may be formed by contacting a solution containing an alkanethiol or mixture thereof with a metallized surface of the invention. The concentration of the alkanethiol in the solution used for alkanethiol adsorption generally ranges from about 1 micromolar to 10 millimolar. When using 1 micromolar solutions, preferred immersion times range from 10 seconds to 24 hours. Particularly preferred immersion times range from 1 minute to 6 hours. Other preferred immersion times range from 30 minutes to 2 hours. Typically, self-assembled monolayers were formed on surfaces of the invention by contacting the metallized gradient surface with an ethanolic solution of an alkanethiol such as hexadecanethiol at a concentration of 1 mM for a period of at least about 1 hour. In one embodiment, a metallized surface is immersed in a 1 mM ethanolic solution of hexadecanethiol for about 4 hours to form a self-assembled monolayer. Longer or shorter contact times may be used. Preferably, the contact time will be sufficient to form a densely packed monolayer as will be apparent to those skilled in the art. Generally, the lower the concentration of the alkanethiol in the alkanethiol solution, the longer the metallized surface will be contacted with the alkanethiol solution. Conversely, the higher the concentration of the alkanethiol in the alkanethiol solution, the shorter the metallized surface will be contacted with the alkanethiol.

Alkanethiols are typically adsorbed onto the metallized surface of the support in solutions at temperatures ranging from about 15° C. to about 60° C., from about 20° C. to about 40° C., from about 22° C. to about 40° C., or from about 25° C. to about 37° C. In some embodiments, the temperature range is from about 22° C. to about 28° C., and in other embodiments the temperature is about 25° C. A steady temperature is not necessary, and the temperature may be increased or decreased during the alkanethiol adsorption. Generally, the temperature of the alkanethiol solution is not critical to the preparation of the self-assembled monolayer on the metallized surface. After an alkanethiol has been adsorbed onto a metallized surface, the surface is typically rinsed with a volatile solvent such as ethanol. The ethanol or other volatile solvent is then usually removed by blowing a stream of $N_2$ or other inert gas over the rinsed surface.

Substrates may be formed from the metallized surfaces with gradients in surface topography of the invention. Generally, such a substrate includes: a support, having a first end, a second end, and a region between the first end and the second end; a metallized surface disposed over the support. The metallized surface includes a layer of metal with a surface topography that includes a plurality of repeating hills and valley as shown in FIG. 2. The metallized surface includes a gradient such that the layer of metal is thicker at the second end than it is at the first end and gradually changes in the region between the first end and the second end. Additionally, the hills are higher and the valleys are deeper at one end than they are at the other end, and the height of the hills and the depth of the valleys gradually changes in the region between the first end and the second end of the support. Substrates may also include an optional adhesion promoting material such as, but not limited to, titanium disposed between the metallized surface and the support. Such substrates may also include a self-assembled monolayer attached to a top surface of the metallized surface and/or a layer of a protein. In some embodiments, the anchoring energy of a liquid crystal disposed over the metallized surface varies across the surface from the first end of the support to the second end of the support, wherein an analyte bound to the surface will disrupt the uniform alignment of the liquid crystal on regions of the surface with low anchoring energies, but will not disrupt the alignment of the liquid crystal on regions of the surface that possess high anchoring energies. In some such embodiments, a liquid crystal disposed on the metallized surface will be oriented in one direction at the first end of the support and will be oriented in a different direction at the second end of the support. In some such embodiments, the orientation of the liquid crystal at the first end of the support is perpendicular to the orientation of the liquid crystal at the second end of the support. In other embodiments, a liquid crystal disposed on the metallized surface will be uniformly oriented at either the first end or the second end of the support and will not be uniformly oriented at the other end of the support. In some embodiments, the support is planar, and in some such embodiments, the support is a glass slide which, in some embodiments, has a length of at least 7 cm. In some embodiments, the metal of the metallized surface is gold or silver. In some embodiments, the substrate may include a liquid crystal disposed over the self-assembled monolayer.

Various types of liquid crystals may be used in conjunction with the present invention. Examples of these include both nematic and smectic liquid crystals. Other classes of liquid crystals that may be used in accordance with the invention include, but are not limited to: polymeric liquid crystals, thermotropic liquid crystals, lyotropic liquid crystals, columnar liquid crystals, nematic discotic liquid crystals, calamitic nematic liquid crystals, ferroelectric liquid crystals, discoid liquid crystals, and cholesteric liquid crystals. Examples of just some of the liquid crystals that may be used are shown in Table 1. A particularly preferred liquid crystal for use in the present invention includes 4-cyano-4'-pentylbiphenyl (5CB).

TABLE 1

Molecular Structure of Mesogens Suitable for use in Liquid Crystal Devices

| Mesogen | Structure |
|---|---|
| Anisaldazine | $CH_3-O-\text{C}_6\text{H}_4-CH=N-N=CH-\text{C}_6\text{H}_4-O-CH_3$ |
| NCB | $C_nH_{2n+1}-\text{C}_6\text{H}_4-\text{C}_6\text{H}_4-CN$ |
| CBOOA | $C_9H_{19}-O-\text{C}_6\text{H}_4-N=CH-\text{C}_6\text{H}_4-CN$ |
| Comp A | $C_7H_{15}-\text{C}_6\text{H}_{10}-\text{C}_6\text{H}_4-COO-\text{C}_6\text{H}_4-NCS$ |
| Comp B | $C_8H_{17}-O-\text{C}_6\text{H}_4-O-CO-\text{C}_6\text{H}_4-O-CH_2-\text{C}_6\text{H}_4-CN$ |
| $DB_7NO_2$ | $C_7H_{15}-\text{C}_6\text{H}_4-O-CO-\text{C}_6\text{H}_4-O-CO-\text{C}_6\text{H}_4-NO_2$ |
| DOBAMBC | $C_{10}H_{21}-O-\text{C}_6\text{H}_4-CH=N-\text{C}_6\text{H}_4-CH=CH-COO-CH_2-CH(CH_3)(C_2H_5)$ |
| nOm<br>n = 1, m = 4: MBBA<br>n = 2, m = 4: EBBA | $C_nH_{2n+1}-O-\text{C}_6\text{H}_4-CH=N-\text{C}_6\text{H}_4-C_mH_{2m+1}$ |
| nOBA<br>n = 8: OOBA<br>n = 9: NOBA | $C_nH_{2n+1}-O-\text{C}_6\text{H}_4-COOH$ |
| nmOBC | $C_nH_{2n+1}-O-CO-\text{C}_6\text{H}_4-\text{C}_6\text{H}_4-O-C_mH_{2m+1}$ |
| nOCB | $C_nH_{2n+1}-O-\text{C}_6\text{H}_4-\text{C}_6\text{H}_4-CN$ |

TABLE 1-continued

Molecular Structure of Mesogens Suitable for use in Liquid Crystal Devices

| Mesogen | Structure |
|---|---|
| nOSI | $C_nH_{2n+1}-O-\text{[phenyl]}-\text{[phenyl]}-COO-\text{[phenyl]}-CH_2-CH(CH_3)(C_2H_5)$ |
| 98P | $C_3H_7-[CH_2(CH_3)]_5-O-\text{[phenyl]}-\text{[pyrimidine]}-C_8H_{17}$ |
| PAA | $CH_3-O-\text{[phenyl]}-N=N(O)-\text{[phenyl]}-O-CH_3$ |
| PYP906 | $C_9H_{19}-\text{[pyridine]}-\text{[phenyl]}-O-C_6H_{13}$ |
| nSm | $C_nH_{2n+1}-O-\text{[phenyl]}-CO-S-\text{[phenyl]}-C_mH_{2m+1}$ |

Optical cells may be constructed from surfaces with gradients in nanometer-scale topography or from surfaces in which the surface topography has been optimized for use in a liquid crystal detection device. As described in the Results and Discussion section, cells formed from one surface with a gradient in nanometer-scale topography and one surface with uniform topography may be used to determine optimum deposition angles and surface topography for a liquid crystal detection application. Optical cells may include a spacing material such as a film, positioned parallel to but a spaced distance away from the top surface of the surface with gradients in nanometer-scale topography or the surface with optimized surface topography. The spacing material and the top surface of the surface with gradients in surface topography or the surface with optimized surface topography thus define a cavity that may be filled with a liquid crystal. As noted above, an optical cell may also contain another surface that uniformly anchors liquid crystals positioned parallel to and over the top of the surface with gradients or the surface with optimized topography. Typically, a spacing material such as a film is positioned between the surface with gradients or the surface with optimized surface topography and the surface that uniformly anchors liquid crystals. The spacing material is preferably a film of a defined thickness that is preferably stable in the presence of the liquid crystal material, easy to handle, and does not contaminate the liquid crystal. A variety of films may be suitable for use as spacing materials in the optical cells according to the invention as will be apparent to those skilled in the art. A preferred film spacing material is preferably made of a polymeric material such as Mylar® brand film or Saran® brand wrap. The film spacing material is typically placed between the top surface of the surface with gradients in nanometer-scale topography or the surface with optimized surface topography and the surface that uniformly anchors liquid crystals such that the top surface of the surface with gradients or the surface with optimized topography and the surface that uniformly anchors liquid crystals face each other. The spacing material may also be comprised of rods or microparticles such as microspheres of defined diameter that are dispersed into the liquid crystal so as to separate the two surfaces forming the optical cell.

Various materials may be used as the surface that uniformly anchors liquid crystals in optical cells of the invention including, but not limited to, rubbed surfaces, glass surfaces modified by reaction with octadecyltrichlorosilane, and glass surfaces with obliquely deposited gold films such as those where the gold has been deposited at a uniform or approximately uniform angle of incidence. Other suitable surfaces that uniformly anchor liquid crystals include rubbed glass slides and glass slides with shear-deposited Teflon.

Metallized surfaces possessing gradients in surface topography may be used to determine optimal angles for obliquely depositing metal onto supports for use in liquid crystal assay devices as demonstrated in the Examples section with a liquid crystal device which uses bovine serum albumin (BSA) to detect anti-BSA IgG. A method for determining an optimal angle of metal deposition for a metallized surface in a liquid crystal assay device includes:

(a) contacting a liquid crystal, such as 5CB, with a receptor molecule disposed on a first metallized surface of a first support in a first liquid crystal cell. Suitable receptor molecules include, but are not limited to, proteins, immunoglobulins, portions of an immunoglobulins, peptides, polypeptides, carbohydrates, fragments of RNA, and fragments of DNA. The first liquid crystal cell includes a first surface that uniformly anchors the liquid crystal and a second surface that has the receptor molecule disposed on the first metallized surface of the first support. The first surface and the second surface are spaced apart facing each other in the first liquid crystal cell, and the first support of the second surface includes a first end, a second end, and a region between the first and second ends. The first metallized surface of the first support has a gradient in surface topography that is formed by obliquely depositing a metal such as, but not limited to gold, silver, or the like, on the first support in accordance with the invention at angles of incidence that vary across the support from a first angle of incidence at the first end of the first support to a second angle of incidence at the second end of the support. The difference between the first and second angles of incidence of the first support is at least 3°, but in some embodiments is at least 5°, is at least 8°, or is at least 10°.

(b) contacting the liquid crystal with a receptor-analyte complex molecule disposed on a second metallized surface of a second support in a second liquid crystal cell. The receptor-analyte complex molecule is formed by reaction of the receptor molecule with an analyte molecule that binds to the receptor molecule. For example, a receptor-analyte complex may be formed by contacting a surface coated with BSA with an analyte such as anti-BSA IgG which binds to the BSA forming the receptor-analyte complex. As in the first liquid crystal cell described above, the second liquid crystal cell includes a surface that uniformly anchors the liquid crystal (a third surface) and a surface (a fourth surface) that has the receptor-analyte complex molecule disposed on the second metallized surface of the second support. The third surface and the fourth surface are spaced apart facing each other in the second liquid crystal cell. Like the first support, the second support of the fourth surface has a third end, a fourth end, and a region between the third and fourth ends, and the second metallized surface of the second support has a second gradient in surface topography that is formed by obliquely depositing the metal on the second support at angles of incidence that vary from a third angle of incidence at the third end of the second support to a fourth angle of incidence at the fourth end of the second support. The difference between the third and fourth angles of incidence of the second support is substantially the same as the difference between the first and second angles of incidence of the first support. Additionally, the first angle of incidence is substantially the same as the third angle of incidence, and the second angle of incidence is substantially the same as the fourth angle of incidence such that the first metallized surface is substantially the same as the second metallized surface. The angles of incidence are all measured from the normal. One skilled in the art will recognize that the metallized surfaces of the first and second supports should be as much alike as possible or substantially the same so that the difference in the optical properties between the liquid crystals in the first and second liquid crystal cells will be attributable to the receptor disposed on the surface in the first liquid crystal cell and the receptor-analyte complex disposed on the surface in the second liquid crystal cell. However, one skilled in the art will also recognize that the metallized surfaces of the first and second supports need not be identical.

(c) comparing at least one optical property such as, but not limited to, luminance, of the liquid crystals in the first and second liquid crystal cells.

(d) determining the angle of incidence that maximizes the difference in the at least one optical property of the liquid crystals in the first and second liquid crystal cells.

In some embodiments of the method for determining the optimal angle of metal deposition, the metal obliquely deposited on the first and second supports is silver or gold. In some such embodiments, the gold or silver is obliquely deposited on a layer of titanium or other adhesion promoting material. In other embodiments of the method for determining the optimal angle of metal deposition, the first surface that uniformly anchors the liquid crystal in the first liquid crystal cell and the third surface that uniformly anchors the liquid crystal in the second liquid crystal cell comprise glass slides with a surface comprising obliquely deposited gold. However, such surfaces that uniformly anchor liquid crystals may include any of those described above such as rubbed surfaces.

In the method for determining the optimal angle of metal deposition, the at least one optical property of the liquid crystals that may be compared in the first and second liquid crystal cells is luminance. In some embodiments, the angle of incidence that maximizes the difference in the at least one optical property of the liquid crystals in the first and second liquid crystal cells is determined by measuring the standard deviation in the luminance of the liquid crystal in the first and second liquid crystal cells at an orientation of 45° or is determined by measuring the difference in luminance between orientations of 0° and 45°.

Alternative embodiments of the method for determining the optimal angle of metal deposition are also provided. In one alternative embodiment, the first surface that uniformly anchors the liquid crystal in the first liquid crystal cell is replaced by a first surface that is substantially the same as the second surface that comprises the receptor molecule disposed on the first metallized surface of the first support. In such an embodiment, the third surface that uniformly anchors the liquid crystal in the second liquid crystal cell is also typically replaced by a third surface that is substantially the same as the fourth surface that comprises the receptor-analyte complex molecule disposed on the second metallized surface of the second support. In such embodiments, the first surface typically includes the receptor molecule which is disposed on a metallized surface of a support as in the second surface of the first liquid crystal cell. In such embodiments, the support of the first surface has a first end, a second end, and a region between the first and second ends like the support of the second surface of the first liquid crystal cell. In such embodiments, the metallized surface of the support of the first surface of the first liquid crystal cell includes a gradient substantially similar to that of the first metallized surface of the second surface of the first liquid crystal cell because it is formed by depositing the metal at angles of incidence that are substantially the same, if not identical, with those used to form the first metallized surface of the second surface of the first liquid crystal cell. Therefore, in such alternative embodiments, the first surface is substantially the same as the second surface.

In alternative embodiments of methods for determining the optimal angle for metal deposition for a liquid crystal assay device such as that described in the immediately preceding paragraph, the third surface typically includes the receptor-analyte complex molecule which is disposed on a metallized surface of a support as in the fourth surface of the second liquid crystal cell. In such embodiments, the support of the third surface has a third end, a fourth end, and a region between the third and fourth ends like the support of the fourth surface of the second liquid crystal cell. In such embodiments, the metallized surface of the support of the third surface of the second liquid crystal cell includes a gradient substantially similar to that of the second metallized surface of the fourth surface of the second liquid crystal cell because it is formed by depositing the metal at angles of incidence that are substantially the same, if not identical, with those used to form the second metallized surface of the fourth surface of the second liquid crystal cell. Therefore, in such alternative embodiments the third surface is substantially the same as the fourth surface.

Once an optimal angle for obliquely depositing a metal has been discovered for a particular liquid crystal assay application according to the above procedure, a metallized surface may be formed and used to construct a liquid crystal assay device with optimized performance. Such a surface typically includes the specific receptor molecule disposed on a metallized surface formed by obliquely depositing a metal such as gold or silver at the optimal angle discovered by the above procedure. Such surfaces may be formed by obliquely depositing the metal on a support such as a glass slide at a distance sufficient that the metal is deposited at or near the optimal angle of incidence across the entire surface of the support.

EXAMPLES

The following materials and methodologies were utilized in the examples discussed in greater detail below.

Materials

Glass microscope slides used in the experiments were marked premium grade and obtained from Fisher Scientific (Pittsburgh, Pa.). Glass slides were cleaned prior to use by treating with "piranha solution" (70% $H_2SO_4$/30% $H_2O_2$). "Piranha solution" should be handled with extreme caution because it reacts violently with organic materials and should not be stored in closed containers. After cleaning for 1 hour at 80° C. in "piranha solution," the slides were rinsed copiously in deionized water and dried under a stream of nitrogen. Prior to use, the clean substrates were stored in an oven heated at 120° C. for at least 3 hours.

BSA (IgG and protease free) was obtained from Jackson ImmunoResearch Laboratories (West Grove, Pa.). Monoclonal anti-BSA IgG was obtained from Sigma (St. Louis, Mo.). Hexadecanethiol (92%) was obtained from Aldrich (Milwaukee, Wis.). The nematic liquid crystal, 4-cyano-4'-pentylbiphenyl (5CB), manufactured by BDH, was purchased from EM industries (Hawthorne, N.Y.). All aqueous solutions were prepared using high-purity deionized water (18 MΩ cm) using a Milli-Q water purification system (Millipore, Bedford, Mass.).

Formation of Metallized Surfaces with Nanometer-Scale Topography

Bilayer films of titanium and gold were evaporated onto clean glass microscope slides within an electron beam evaporator (Tekvak, Brentwood, N.Y.). To begin, the cleaned glass microscope slides were attached to the substrate holder using clips. The microscope slides were always handled with forceps. The glass microscope slides on the holder were then rotated to the appropriate angle for gold deposition. The substrate holder was then bolted to the arm at the top of the electron beam evaporator chamber. The chamber was then pumped down to about $10^{-6}$ Torr. With the crucible containing titanium in position, the electron beam current was slowly ramped up over several minutes with the shutter closed. To begin deposition, the shutter was opened, and the deposition rate (0.02 nm/s) was monitored using a quartz crystal microbalance. Once 8 nm of titanium were measured on the quartz crystal microbalance, the shutter was closed and the electron beam disengaged. After allowing the titanium to cool (5 minutes), the crucible with gold was then moved into position. The procedure of evaporation was repeated with the same deposition rate (0.02 nm/s), but 20 nm of gold were deposited on the quartz crystal microbalance. After the gold was cooled, the evaporator chamber was brought back to atmospheric pressure under nitrogen. The substrate holder was unbolted from the arm at the top of the electron beam evaporator chamber, and the slides with a thin film of titanium and gold deposited on the surface were removed from the holder and stored in covered glass jars.

Formation of Metallized Surfaces with Gradients in Nanometer-Scale Topography Clean glass slides (Fisher finest, premium microscope slides, plain, 3"×1"×1 mm, Cat. No. 12-544-1; Fisher Scientific, Pa.) were mounted vertically using "bulldog" clips onto a circular holder so that the lower end of each glass slide was located 13 cm horizontally and 16 cm vertically from the gold source. The circular holder, named herein as a gradient slide holder, consists of a circular aluminum strip that was 26 cm in diameter, and was annealed to aluminum bars that were bolted to the arm at the top of the electron beam evaporator (Tekvak, Brentwood, N.Y.). The circular aluminum strip was located with the center of the circle 16 cm directly above the gold source. All the glass slides were handled with forceps. Gloves were used at all times. The vacuum of the chamber in the electron beam evaporator was maintained below $10^{-6}$ Torr (about 7–8× $10^{-7}$ Torr). A bilayer of titanium and gold was evaporated and deposited onto the glass slides sequentially. The first layer deposited on the slide was titanium. The electron beam current was slowly ramped up over several minutes to a power of about 6–8 percent with the shutter closed. To begin deposition, the shutter was opened, and the deposition rate (0.02 nm/s) was monitored using a quartz crystal microbalance. Once 2 nm of titanium were measured on the quartz crystal microbalance, the shutter was closed and the electron beam was disengaged. The second layer of metal deposited on the slide was gold. After allowing the titanium to cool for 15 minutes, the metal source was changed to gold. Then, the same procedure of evaporation was repeated as that used for titanium, except that the power of the electron beam current was set at about 12 percent and 5 nm of gold were deposited on the quartz crystal microbalance. After the gold was cooled, the evaporator chamber was filled with nitrogen up to atmospheric pressure. The gradient slides with a thin film of titanium and gold were removed from the holder and stored in covered glass jars.

Formation of Self-Assembled Monolayers

Self-assembled monolayers were formed on the surfaces of gold films on slides by immersion of the slides in ethanol solutions containing hexadecanethiol at a concentration of 1 mM. After immersion in the ethanol solutions for four hours at room temperature, the slides were removed, rinsed with ethanol, and then dried under a stream of gaseous nitrogen.

Immobilization of BSA and Anti-BSA IgG on Gold Films

Substrates supporting obliquely deposited gold films were immersed in a 1 mg/mL solution of BSA in phosphate-buffered saline (PBS, pH 7.4). After immersion for three hours in the BSA PBS solution, the substrates were rinsed for 15 seconds in PBS, rinsed for 15 seconds in water, and then dried under a stream of gaseous nitrogen. For anti-BSA IgG, substrates were immersed in a 100 nM anti-BSA IgG PBS solution for 3 hours with mixing. After immersion in the anti-BSA PBS solution, the substrates were rinsed for 15 seconds in PBS, rinsed for 15 seconds in water, and then dried under a stream of gaseous nitrogen.

Optical Cells

Optical cells were prepared by pairing two glass slides, each of which supported a SAM or protein. The slides were aligned (facing each other) such that the direction of gold deposition on the two slides was parallel. The slides were kept apart by inserting a thin film of Saran Wrap® brand film with a thickness of about 12 $\mu$m at the edge of the glass microscope slides. The cells were held together using "bulldog" clips placed along the edge of the glass microscope slides. The cells were placed on a hot plate and heated to a temperature of about 40° C. The nematic liquid crystal 5CB was heated into its isotropic phase (>35° C.) in a glass syringe. The 5CB was then placed on the edge of each cell on the hot plate. The 5CB was then drawn into the optical cells by capillary action. Once the optical cells were filled with 5CB, the cell was removed from the hot plate and cooled in air to room temperature. Upon cooling, the isotropic phase of 5CB transformed to the nematic phase.

Characterization

Images of the liquid crystals were captured with a CCD camera (DXC-151A, Sony, Park Ridge, N.J.) and frame grabbing software (Mediagrabber, Rasterops Inc., Santa Clara, Calif.) that was attached to a polarized light microscope (BX60, Olympus, Tokyo, Japan). The average luminance (L, average pixel value on a scale of 0–255) was calculated using Photoshop® brand software (Adobe Systems Inc., San Jose, Calif.) after conversion of the image from color to gray scale. Consistent settings of the microscope light source (50% of maximum intensity, 50% open aperture, and no condenser) and CCD camera (no auto color correction and $\frac{1}{400}^{th}$ second shutter speed for BSA experiments) were used to permit the comparison of values of luminance between samples.

DISCUSSION OF EXPERIMENTAL RESULTS

Liquid crystals have been used to amplify and transduce a range of bio/chemical events on surfaces. Examples include receptor-mediated binding of protein to surfaces, chemical transformations of surfaces, and binding of low molecular weight species to surfaces. See V. K. Gupta; J. J. Skaife; T. B. Dubrovsky; N. L. Abbott, Science 279, 2077 (1998); J. J. Skaife; N. L. Abbott, Langmuir 16, 3529 (2000); R. R. Shah; N. L. Abbott, J. Am. Chem. Soc. 121, 11300 (1999); and R. R. Shah; N. L. Abbott, Science 293, 1296 (2001). These events have been imaged using the surface-driven orientational behavior of liquid crystals. In order to investigate these binding events, surfaces had to be prepared with specific chemical functionality and nanometer-scale topography such that the targeted surface phenomenon perturbed the balance of forces acting between the liquid crystals and the surfaces. These perturbations triggered changes in the orientations of the bulk of liquid crystals, and thus altered the optical appearance of the liquid crystals when viewed under polarized light.

One procedure used in past studies for fabricating surfaces with nanometer-scale topography is physical vapor deposition of gold. See R. C. Jaeger, Introduction to Microelectronic Fabrication, Addison-Wesley Pub. Co.: New York, (1988); H. Van Kranenburg; C. Lodder, Mat. Sci. & Eng. R11, 295 (1994); and D. L. Smith, Thin-Film Deposition: Principles & Practice, McGraw-Hill, Inc.: New York, (1995). In physical vapor deposition, gold is evaporated inside a low pressure chamber (about $10^{-7}$ torr) and is then deposited onto substrates at an oblique angle of incidence and from a single azimuthal direction. Due to self-shadowing, the depositing gold forms an anisotropic nanometer-scale topography on the substrate. See H. Van Kranenburg; C. Lodder, Mat. Sci. & Eng. R11, 295 (1994); and D. L. Smith, Thin-Film Deposition: Principles & Practice, McGraw-Hill, Inc.: New York, (1995); L. A. Goodman; J. T. McGinn; C. H. Anderson; F. Digeronimo, IEEE Trans. Elec. Dev. ED-24, 795 (1977); G. Mbise; G. B. Smith; C. G. Granqvist, Thin Solid Films, 174, L123 (1989); and R. N. Tait; T. Smy; M. J. Brett, J. Vac. Sci. Tech. A,10, 1518 (1992). Past studies using atomic force microscopy have revealed that the nanometer-scale topography of the surface is greatest (roughest) in an azimuthal direction that is parallel to the plane of incidence of the gold during deposition of the film. When an angle of incidence of 45° (measured from normal) was used, a characteristic distance between repeating hills and valleys of about 20 nm and a characteristic height between hills and valleys of about 1 nm was measured. See J. J. Skaife; J. M. Brake; N. L. Abbott, Langmuir 17, 5448 (2001). Changes in the angle of deposition of the gold leads to variations in the characteristic width and height of topographical features. Gold films deposited at high angles of incidence (measured from normal to the surface) possess topographies that lead to higher elastic anchoring energies of liquid crystals on these surfaces. Because changes in the nanometer-scale topography can influence the strength of anchoring of a liquid crystal on a surface, manipulation of the topography offers a means by which the response of the liquid crystal to a targeted surface phenomenon can be designed.

In conventional deposition methodologies, gold was deposited at a single angle of incidence onto silica substrates by locating each substrate approximately 500 mm from the source of gold within the evaporator. In direct contrast, the present invention provides a novel procedure for deposition of a metal such as gold onto glass substrates and other supports such that the angle of deposition of the metal and the thickness of the metal (and thus the nanometer-scale topography) varies continuously with position across the support. Substrates prepared using the procedures of the present invention possess gradients in nanometer-scale topography across their surfaces, and such metallized surfaces can be used to (i) rapidly explore the effect of nanometer-scale topography on the orientations of liquid crystals, and to (ii) optimize selection of the nanometer-scale topography to detect a targeted protein-receptor binding event on a surface. Past studies have reported methods for preparing surfaces with gradients in polymer blend composition, surface coverage of platinum, and surface hydrophobicity. See J. C. Meredith; A. Karim; E. J. Amis, Macromolecules 33, 5760 (2000); S. Jayaraman; A. C. Hillier, Langmuir 17, 7857 (2001); and M. K. Chaudhury; G. M. Whitesides, Science 256, 1539 (1992).

Bilayer films of titanium and gold were evaporated onto clean glass microscope slides within an electron beam evaporator (Tekvak, Brentwood, N.Y.). See J. J. Skaife; N. L. Abbott, Chem. Mater. 11, 612 (1999) for a general description of electron beam evaporation techniques. The spatial variation of the angle of incidence of gold across each slide was calculated from the distance between each slide and the source of gold in the evaporator as described above in the description of FIG. 1. By placing a slide a distance of about 20 cm from the gold source with an orientation such that the variation in the angle of deposition occurred over the length of the slide (7.5 cm), the variation in the angle of deposition across the slide was calculated to be about 10° (($\theta_1-\theta_2$) see FIG. 1 and FIG. 3). The thickness of metal deposited onto the substrate was calculated to vary from about 8 nm (at $\theta_1$) to about 18 nm (at $\theta_2$) for Au and from about 3 nm (at $\theta_1$) to about 7 nm (at $\theta_2$) for Ti. This variation in thickness is due to both changes in the incident angle across the substrate and variation of the distance between the source and substrate. Both the gradient in thickness of the gold film and the gradient in angle of deposition contribute to formation of the gradient in nanometer-scale topography across the substrate (See FIG. 2 for schematic representation). The slides were supported using bulldog clips from a circular holder that was made to support slides for oblique deposition according to the invention. The addition of the circular support holder was the only modification made to the electron beam evaporator. The slides were held in a vertical position during the oblique deposition. The circular holder was placed on the framework of the electron beam evaporator. The circular holder for use in forming surfaces with gradients and the single angle of deposition holder were mounted interchangeably with a bolt to the arm at the top of the electron beam evaporator.

The orientational behavior of nematic phases of 4-cyano-4'-pentylbiphenyl (5CB) anchored on gold films that possessed gradients in nanometer-scale topography and supported self-assembled monolayers (SAMs) formed from alkanethiols was investigated. Past studies have demonstrated that the azimuthal orientation of 5CB on SAMs formed from alkanethiols with odd and even numbers of carbons reflects a balance of molecular and topographical effects on the liquid crystal. See V. K. Gupta; N. L. Abbott, *Science*, 276, 1533 (1997) and J. J. Skaife; N. L. Abbott, *Langmuir*, 17, 5595 (2001). Alkanethiols with an odd number of carbons form SAMs that orient the liquid crystal in an azimuthal orientation that is parallel to the direction of minimum roughness on the surface. On the other hand, SAMs formed from alkanethiols with an even number of carbons orient nematic 5CB in an azimuthal orientation that is parallel to the direction of maximum roughness on the surface when formed on gold films deposited at an angle of incidence of 40°. It was demonstrated that the topography dominates molecular interactions between the liquid crystal and the surface, when using even-chain length SAMs and high angles of deposition of the gold, thus causing the liquid crystal to orient in an azimuthal direction that is parallel to the direction of minimum roughness on the surface.

Liquid crystal optical cells were prepared using a top surface or substrate that was a SAM formed from hexadecanethiol on a gold film deposited at an angle of incidence of 40° (50 cm between the source of gold and the substrate—See FIG. 3). The bottom surface or substrate of the liquid crystal cell comprised a SAM formed from hexadecanethiol on a gold film that was deposited such that the angle of incidence of gold changed from 48° to 58° ($\theta_1-\theta_2=10°$) and the thickness of the gold changed from about 11 nm ($\theta_1, 58°$) to about 23 nm ($\theta_2, 48°$) across the slide. The two substrates were oriented such that the azimuthal directions of deposition of the gold on the two slides were parallel to each other. FIG. 4 shows the appearance of the liquid crystal (thickness of about 12 μm) within the cell when viewed using crossed polars (top) and parallel polars (bottom).

In FIG. 4, the liquid crystal anchored on the area of the gold film deposited at 48° appears dark under crossed polars (top). This result indicates that the liquid crystal is anchored in the same azimuthal direction (in the direction of maximum roughness) on the surfaces of both the top and bottom substrates of the liquid crystal cell. The crossed polars therefore extinguish light transmitted through the liquid crystal because the polarization of the incident light is not changed by transmission through the cell of uniformly oriented liquid crystal. In contrast, in regions of the gold film deposited at 58°, the cell appears light under crossed polars, but dark under parallel polars. This result indicates that the liquid crystal within this region of the cell possesses a 90° twist distortion where the azimuthal alignment is in the direction of maximum roughness for the gold film deposited at 40°, but in the direction of minimum roughness on the portion of the bottom slide where the gold film was deposited at an angle of 58°. The polarization of the incident light is rotated by 90°, thereby allowing light to exit through the crossed polarizer.

Inspection of FIG. 4 reveals that the transition from uniform to twisted liquid crystal occurs in a region of the gold film deposited at an angle of incidence of about 55° (gold thickness of about 13 nm). This result demonstrates that at a gold deposition angle of about 55°, the orientation of the liquid crystal switches from one that reflects the molecular structure of the SAM to one that reflects the topography of the surface for this system. At angles of deposition of less than 55°, the molecular structure of the SAM dictates the orientation of the liquid crystal, whereas at angles of deposition greater than 55° the effects of topography dominate. This is consistent with a gradient in anchoring energy of liquid crystal on the surface. This striking result shown in FIG. 4 also suggests that angles of deposition of about 55° and gold thickness of about 13 nm may be optimal for reporting chemical transformations that give rise to changes in the molecular interactions between 5CB and monolayers formed on these surfaces.

One application for gradient metal films is detection of targeted binding events on surfaces using liquid crystals. See J. J. Skaife; N. L. Abbott, *Langmuir*, 17, 5595 (2001). Because proteins are similar in size to the topography (1–10 nm) of the gold films, the binding of proteins to receptors disposed on the nanometer-scale topography can disrupt the alignment of the liquid crystals by masking the surface topography. In many systems of interest, a first protein bound to the surface acts as a receptor for a second protein. In order to detect the second protein, the first protein must not disrupt the alignment of the liquid crystal. This indicates that control of surface topography is important in obtaining optimum results and improved performance in liquid crystal assay devices. Surfaces with gradients in topography were used to explore the effects of topography and protein binding events on the alignment of liquid crystals. These results may subsequently be used to prepare surfaces with topographies that are optimized for employment in liquid crystal-based assays as demonstrated herein. Furthermore, kits may include two or more supports prepared at different ranges of angles of incidence of deposition. Such supports may be used to determine the optimum angles of incidence for a particular liquid crystal assay application.

Figure 7:
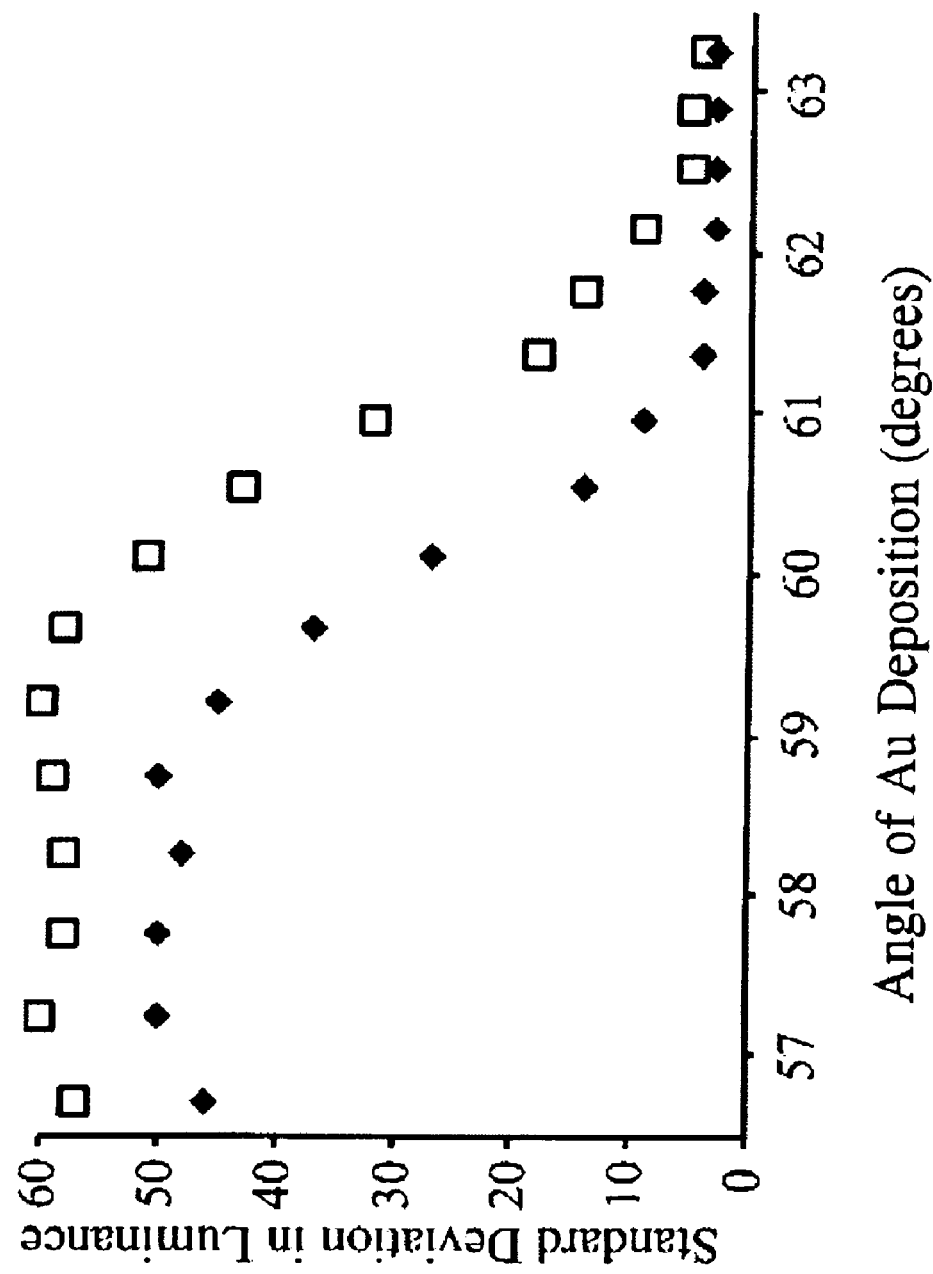
FIG. 7 is a graph of the standard deviation of luminance of the sample at an orientation of 45° as a function of the angle of gold deposition where (♦) corresponds to the slide with the BSA (FIG. 5) and (□) corresponds to the slide with the BSA/anti-BSA (FIG. 6).

A model system utilizing BSA and anti-BSA IgG was employed to demonstrate how gradient surfaces can be used to optimize the surface topography of surfaces utilized in liquid crystal detection devices. Using gold films that possess gradients in surface topography, the optimal angle of deposition was identified for detection of anti-BSA IgG by surfaces which included immobilized BSA. The same procedure can be used to determine optimal surface topography with any suitable receptor-analyte pair that may be detected using liquid crystals. FIGS. 5 and 6 are scanned optical images of liquid crystal cells possessing surfaces that support either BSA (FIG. 5) or BSA to which anti-BSA IgG was bound (FIG. 6). The top images of FIGS. 5 and 6 show the entire length of the slides when oriented (long axis) parallel to the polarizer of the microscope and the bottom images shows the entire length of the slides when they are oriented at an angle of 45° to the polarizer of the microscope. Referring to FIGS. 5 and 6, in regions of the gold film deposited at about 56° (gold thickness of about 13 nm), both the BSA and BSA/anti-BSA IgG complex mask the topography of the surface thereby causing non-uniform alignment of the liquid crystal 5CB. When the alignment of the liquid crystal is non-uniform, there is little modulation in the optical appearance of the liquid crystal when it is rotated between crossed polarizers. Therefore, a surface formed at an angle of incidence of 56° would not provide optimal utility in detecting binding of anti-BSA IgG to BSA. In regions of the gold film deposited at about 63° (gold thickness of about 7 nm, right hand side of FIGS. 5 and 6), the liquid crystals are uniformly oriented on the surface with either BSA or BSA/anti-BSA IgG present on the surface. Therefore, at deposition angles of about 63°, the topography of the gold film is sufficiently pronounced that neither BSA nor the BSA/anti-BSA IgG complex can mask the topography that orients the liquid crystal. However, as shown in FIGS. 5 and 6, in regions of the gold film deposited at angles of about 60° (gold thickness of about 9 nm), BSA and complexes of BSA with anti-BSA IgG have substantially different effects on the liquid crystal such that optimal detection of binding can be observed. FIG. 7 is a graph of the standard deviation of luminance of the sample at an orientation of 45° as a function of the angle of gold deposition where (♦) corresponds to the slide with the BSA (FIG. 5) and (□) corresponds to the slide with the BSA/anti-BSA (FIG. 6). The uniformity of the orientation of the liquid crystal was characterized by measuring the standard deviation of the luminance of the sample at an orientation of 45° (FIG. 7). The uniformity of the orientation of the liquid crystal was also characterized by measuring the difference in luminance between sample orientations of 0° and 45°—the results using this method were similar to those obtained using the standard deviation. From FIGS. 5, 6, and 7, it is apparent that the maximal difference between BSA and BSA/anti-BSA IgG occurs at the angle of deposition of gold of 60° (gold thickness of about 9 nm). At this angle of deposition, the BSA does not mask the topography of the surface that orients the liquid crystal (FIG. 5). However, the presence of anti-BSA IgG bound to the BSA is sufficient to mask the topography of the surface and leads to a non-uniform orientation of the liquid crystal (FIG. 6). Therefore, a surface with an angle of deposition of 60° and a gold thickness of about 9 nm should provide optimal performance for detecting anti-BSA IgG binding to BSA. These results demonstrate that surfaces with continuous gradients in topography can be used to screen and determine the optimal topography on which to detect binding events such as the binding of anti-BSA IgG to BSA. Those skilled in the art will recognize that the procedure described above may be used to optimize surfaces for use in liquid crystal devices for a wide range of analytes.

In summary, fabrication of substrates with surfaces that possess gradients in nanometer-scale topography may be accomplished using the methods herein described. Such substrates have important utility in investigating the anchoring of liquid crystals to surfaces with anisotropic topography. By forming SAMs from alkanethiols on gold films with gradients in topography, deposition conditions can be identified that lead to a surface on which the effects of molecular structure and topography on the liquid crystal are in balance. Furthermore, surfaces that possess gradients in nanometer-scale topography may be used to identify and prepare optimized surfaces on which to detect protein-receptor and other interactions in liquid crystal devices.

Surfaces that possess gradients in surface topography according to the invention also have application in other areas. For example, surfaces with gradients may be used to investigate cell migration on gradient surfaces thereby providing information on whether a particular cell type prefers smoother or rougher surfaces. Surfaces with gradients according to the invention may also be used to initiate cell migration and facilitate research in tissue engineering and cancer where cell migration plays an important role. To evaluate the effect of gradient topography at nanometer-scale on cell migration, mammalian cells (Albino 3T3-Swiss fibroblast (American Type Culture Collector)) are plated in a confined region in the middle of a gradient gold substrate that presents RGD ligands with a background of tri(ethylene glycols) to facilitate specific cell adhesion. The cell culture is confined in a microcontact-printed region that presents methyl-terminated SAMs (hexadecanethiols) and is allowed to adhere for 30 minutes. The cell medium is then exchanged with fresh DMEM (Dulbecco's Modification of Eagle's Medium) supplement with serum for another 8 hours, at which time the cells grow and replicate to cover the region of the microcontact-printed region. The DMEM supplement is then changed with serum with pure PBS buffer to starve the fibroblasts, and the migration of the cells is observed with an optical microscope. The cells are found to migrate with a much faster rate towards the side of the gradient with greater roughness than towards the smooth side of the gold gradient substrate. Surfaces with gradients may also be used to assemble functional materials on gradient surfaces such as conducting polymers and to present gradient functions on surfaces.

All references cited herein are specifically incorporated herein by reference for all purposes.

It is understood that the invention is not limited to the embodiments set forth herein for illustration, but embraces all such forms thereof as come within the scope of the following claims.

What is claimed is:

1. An analyte detector comprising a substrate possessing gradients in surface topography, comprising:

(a) a support having a first end, a second end, and a region between the first end and the second end;

(b) a metallized surface disposed over the support, wherein the metallized surface comprises a layer of metal with a surface topography that comprises repeating hills and valleys, wherein the metallized surface comprises a gradient wherein the layer of metal is thicker at the second end than it is at the first end and gradually changes in the region between the first end and the second end, and further wherein the hills are higher and the valleys are deeper at one end than they are at the other end and the height of the hills and the depth of the valleys gradually changes in the region between the first end and the second end of the support;

(c) an optional adhesion promoting material disposed between the metallized surface and the support;

(d) a self-assembled monolayer or a layer of protein attached to a top surface of the metallized surface; and (e) a liquid crystal disposed above the self-assembled monolayer or the layer of protein, wherein the anchoring energy of the liquid crystal disposed over the metallized surface varies across the surface from the first end of the support to the second end of the support, and an analyte bound to the surface disrupts the uniform alignment of the liquid crystal on regions of the surface with low anchoring energies, but does not disrupt the alignment of the liquid crystal on regions of the surface that possess high anchoring energies.

2. The analyte detector of claim 1, wherein the liquid crystal is 4-cyano4'-pentylbiphenyl.

3. The analyte detector of claim 1, wherein the self-assembled monolayer comprises an alkanethiol that is bound to the metallized surface of the substrate.

4. The analyte detector of claim 1, wherein the optional adhesion promoting material is disposed between the metallized surface and the support.

5. The analyte detector of claim 4, wherein the adhesion promoting material is a layer of titanium deposited on the support.

6. The analyte detector of claim 5, wherein the layer of titanium has a gradient in topography that extends from the first end of the support to the second end of the support.

7. The analyte detector of claim 1, wherein the support is a glass slide.

8. The analyte detector of claim 1, wherein the metal of the metallized surface is gold or silver.

9. The analyte detector of claim 1, wherein the liquid crystal disposed on the metallized surface is oriented in one direction at the first end of the support and is oriented in a different direction at the second end of the support.

10. The analyte detector of claim 1, wherein the liquid crystal disposed on the metallized surface is oriented in a first direction at the first end of the support and is oriented in a second direction at the second end of the support, wherein the second direction is perpendicular to the first direction.

11. The analyte detector of claim 1, wherein the liquid crystal disposed on the metallized surface is uniformly oriented at either the first end or the second end of the support and is not uniformly oriented at the other end of the support.

12. A kit for detecting analytes, comprising:
 (a) a substrate possessing gradients in surface topography, the substrate comprising:
  (i) a support having a first end, a second end, and a region between the first end and the second end;
  (ii) a metallized surface disposed over the support, wherein the metallized surface comprises a layer of metal with a surface topography that comprises repeating hills and valleys, wherein the metallized surface comprises a gradient wherein the layer of metal is thicker at the second end than it is at the first end and gradually changes in the region between the first end and the second end, and further wherein the hills are higher and the valleys are deeper at one end than they are at the other end and the height of the hills and the depth of the valleys gradually changes in the region between the first end and the second end of the support;
  (iii) an optional adhesion promoting material disposed between the metallized surface and the support; and
  (iv) a self-assembled monolayer or a layer of protein attached to a top surface of the metallized surface; and
 (b) a liquid crystal,
 wherein when the liquid crystal is disposed above the self-assembled monolayer or the layer of protein, the anchoring energy of the liquid crystal disposed over the metallized surface varies across the surface from the first end of the support to the second end of the support, and an analyte bound to the surface disrupts the uniform alignment of the liquid crystal on regions of the surface with low anchoring energies, but does not disrupt the alignment of the liquid crystal on regions of the surface that possess high anchoring energies.

13. The kit of claim 12, wherein the liquid crystal is 4-cyano-4'-pentylbiphenyl.

14. The kit of claim 12, wherein the self-assembled monolayer comprises an alkanethiol that is bound to the metallized surface of the substrate.

15. The kit of claim 12, wherein the optional adhesion promoting material is disposed between the metallized surface and the support.

16. The kit of claim 15, wherein the adhesion promoting material is a layer of titanium deposited on the support.

17. The kit of claim 16, wherein the layer of titanium has a gradient in topography that extends from the first end of the support to the second end of the support.

18. The kit of claim 12, wherein the support is a glass slide.

19. The kit of claim 12, wherein the metal of the metallized surface is gold or silver.

20. The kit of claim 12, wherein when the liquid crystal is disposed on the metallized surface, the liquid crystal is oriented in one direction at the first end of the support and is oriented in a different direction at the second end of the support.

21. The kit of claim 12, wherein when the liquid crystal is disposed on the metallized surface, the liquid crystal is oriented in a first direction at the first end of the support and is oriented in a second direction at the second end of the support, wherein the second direction is perpendicular to the first direction.

22. The kit of claim 12, wherein when the liquid crystal is disposed on the metallized surface, the liquid crystal is uniformly oriented at either the first end or the second end of the support and is not uniformly oriented at the other end of the support.

23. A method for manufacturing an analyte detector comprising a substrate possessing gradients in surface topography, the method comprising:
 (a) obliquely depositing a metal from a metal source onto a surface of a support that optionally comprises a layer of an adhesion promoting material, the surface of the support comprising a first end, a second end, and a region between the first and second ends, wherein the second end of the surface is located nearer to the metal source than is the first end, further wherein the metal is deposited onto the first end of the surface at a first angle of incidence as measured from the normal of the support and the metal is deposited onto the second end of the surface at a second angle of incidence as measured from the normal of the support, and still further wherein the first angle of incidence is greater than the second angle of incidence and the metal is deposited onto the region between the first and second ends at angles of incidence that vary from the first angle of incidence to the second angle of incidence over the region to produce a metallized surface;
 (b) forming a self-assembled monolayer on the metallized surface;
 (c) contacting the self-assembled monolayer with a liquid crystal;
 wherein the substrate of the analyte detector comprises:
  (i) the support having the first end, the second end, and the region between the first end and the second end;

(ii) the metallized surface disposed over the support, wherein the metallized surface comprises a layer of metal with a surface topography that comprises repeating hills and valleys, wherein the metallized surface comprises a gradient wherein the layer of metal is thicker at the second end than it is at the first end and gradually changes in the region between the first end and the second end, and further wherein the hills are higher and the valleys are deeper at one end than they are at the other end and the height of the hills and the depth of the valleys gradually changes in the region between the first end and the second end of the support;

(iii) the optional adhesion promoting material disposed between the metallized surface and the support;

(iv) the self-assembled monolayer attached to a top surface of the metallized surface; and (v) the liquid crystal, wherein the liquid crystal is disposed above the self-assembled monolayer, wherein the anchoring energy of the liquid crystal disposed over the metallized surface varies across the surface from the first end of the support to the second end of the support, and an analyte bound to the surface disrupts the uniform alignment of the liquid crystal on regions of the surface with low anchoring energies, but does not disrupt the alignment of the liquid crystal on regions of the surface that possess high anchoring energies.

24. The method of claim 23, wherein the difference between the first angle of incidence and the second angle of incidence is at least 3'.

25. The method of claim 23, wherein the difference between the first angle of incidence and the second angle of incidence is at least 8'.

26. The method of claim 23, wherein the metal source is located in a crucible with a top surface and the support is perpendicularly disposed with respect to the top surface of the crucible.

27. The method of claim 23, wherein the distance between the second end of the support and the metal source is less than 35 cm.

28. The method of claim 23, wherein the support is a glass slide with a length of at least 7 cm.

29. The method of claim 23, wherein the metal is selected from the group consisting of silver and gold.

30. The method of claim 23, wherein the support comprises the adhesion promoting material.

31. The method of claim 30, wherein the adhesion promoting material comprises a layer of titanium.

32. The method of claim 23, wherein the metal obliquely deposited on the surface of the support is gold or silver and the method further comprises first obliquely depositing titanium onto the support at varying angles of incidence to provide the support on which the gold or silver is deposited, wherein the support prior to gold or silver deposition comprises a titanium surface with gradients in surface topography, and further wherein the gold or silver is deposited over the titanium surface of the support.

33. The method of claim 23, wherein the self-assembled monolayer is formed on the metallized surface by contacting a solution of an alkanethiol with the metallized surface.

* * * * *

UNITED STATES PATENT AND TRADEMARK OFFICE
CERTIFICATE OF CORRECTION

PATENT NO. : 6,849,321 B2
DATED : February 1, 2005
INVENTOR(S) : Nicholas L. Abbott, Yan-Yeung Luk and Matthew Lee Tingey It is certified that error appears in the above-identified patent and that said Letters Patent is hereby corrected as shown below:

Column 29,
Line 31, "incidence is at least 3'." should be -- incidence is at least 3º. --.

Column 30,
Line 3, "incidence is at least 8'." should be -- incidence is at least 8º. --.

Signed and Sealed this

Seventh Day of March, 2006

JON W. DUDAS
*Director of the United States Patent and Trademark Office*